(12) United States Patent
Ichikawa et al.

(10) Patent No.: US 7,848,002 B2
(45) Date of Patent: Dec. 7, 2010

(54) METHOD FOR ALIGNING DIE TO SUBSTRATE

(75) Inventors: Hirotoshi Ichikawa, Hachioji (JP); Fusao Ishii, Menlo Park, CA (US)

(73) Assignees: Silicon Quest Kabushiki-Kaisha (JP); Olympus Corporation (JP)

( * ) Notice: Subject to any disclaimer, the term of this patent is extended or adjusted under 35 U.S.C. 154(b) by 17 days.

(21) Appl. No.: 12/004,621

(22) Filed: Dec. 24, 2007

(65) Prior Publication Data

US 2008/0212162 A1    Sep. 4, 2008

Related U.S. Application Data

(60) Provisional application No. 60/877,238, filed on Dec. 27, 2006.

(51) Int. Cl.
G02B 26/00    (2006.01)
G02B 26/08    (2006.01)
H01L 23/02    (2006.01)

(52) U.S. Cl. .................. 359/290; 359/198.1; 257/678

(58) Field of Classification Search .......... 359/198, 359/244, 290, 291, 298, 315, 198.1, 224.1; 174/535; 361/803; 438/64; 257/678
See application file for complete search history.

(56) References Cited

U.S. PATENT DOCUMENTS

| | | | |
|---|---|---|---|
| 5,384,940 A | 1/1995 | Soule et al. | |
| 6,028,351 A * | 2/2000 | Klonis et al. | 257/680 |
| 6,392,144 B1 | 5/2002 | Filter et al. | |
| 6,649,435 B2 | 11/2003 | Liu et al. | |
| 6,825,744 B2 | 11/2004 | Harney | |
| 6,947,200 B2 | 9/2005 | Huibers | |
| 2006/0270179 A1 | 11/2006 | Yang | |

* cited by examiner

*Primary Examiner*—William C Choi
(74) *Attorney, Agent, or Firm*—Bo-In Lin

(57) ABSTRACT

A method for aligning a micro-mirror device die having a plurality of micro-mirror devices formed on a semiconductor substrate and fixing the micro-mirror device die on the semiconductor substrate can be provided. The method comprises a first alignment step of aligning a first guide portion of the micro-mirror device die and a second guide portion of the package substrate and a fixing step of fixing the micro-mirror device die on the package substrate in a position aligned by the first alignment step using the first and second guide portions.

13 Claims, 17 Drawing Sheets

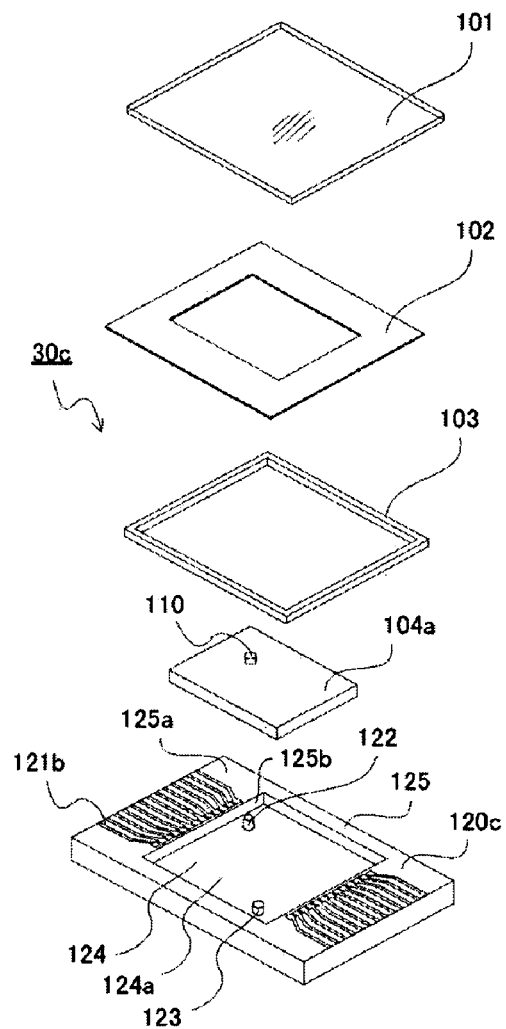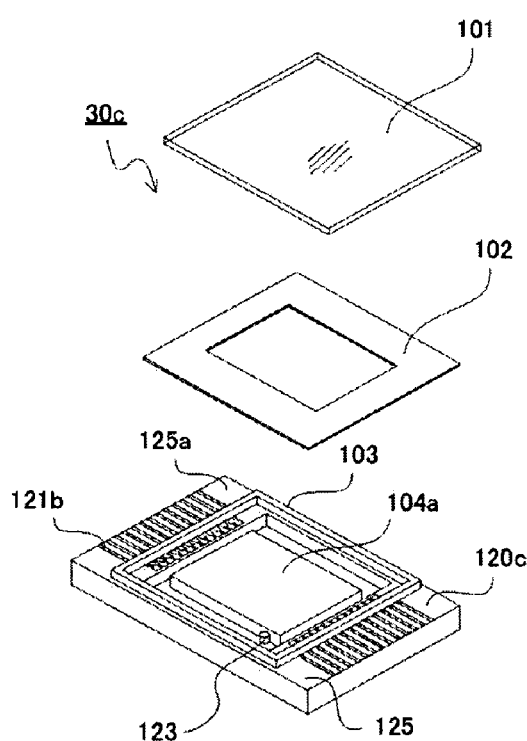
Fig.8A        Fig.8B
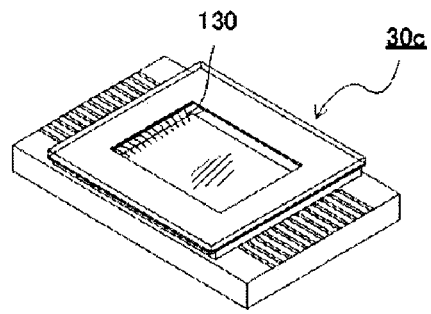
Fig.8C

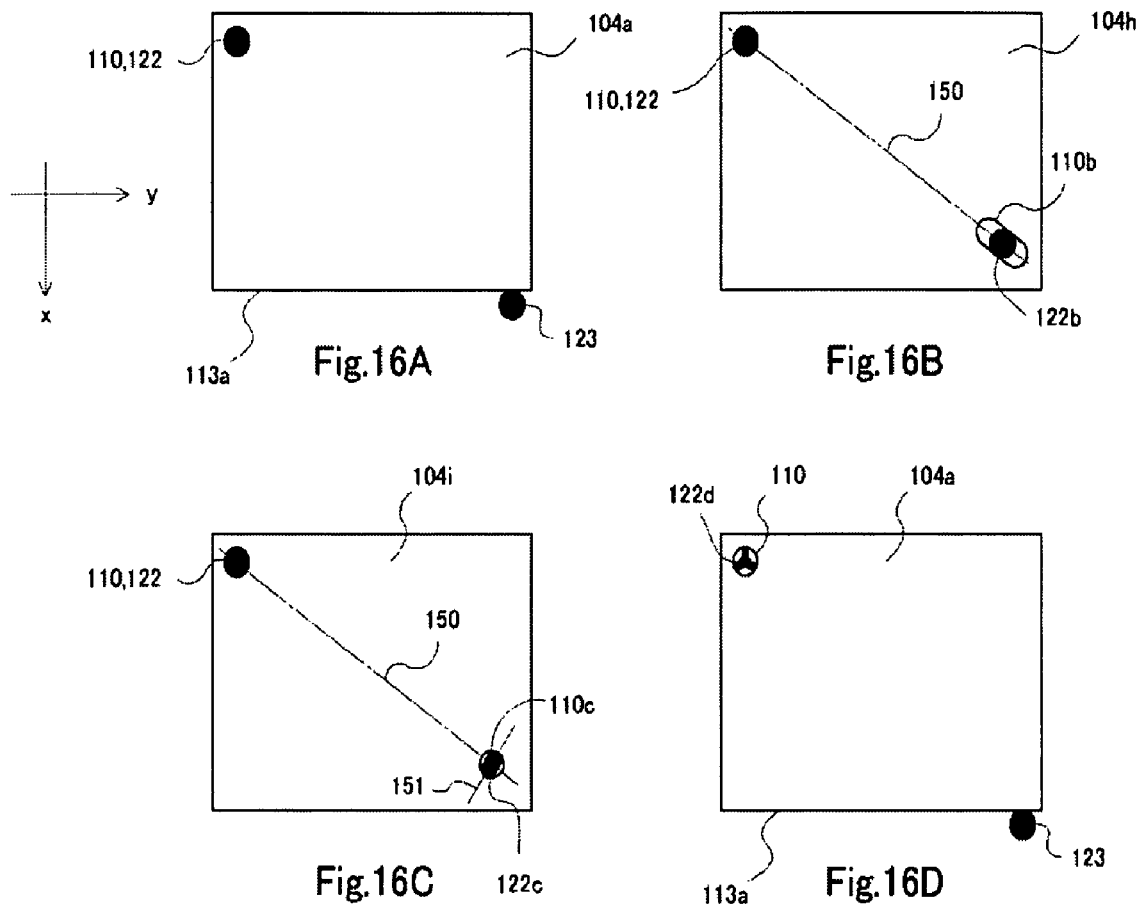

METHOD FOR ALIGNING DIE TO SUBSTRATE

CROSS REFERENCE

This application claims benefit of priority to U.S. Provisional Patent Application Ser. No. 60/877,238 filed on Dec. 27, 2006, the entire contents of which are incorporated by this reference.

BACKGROUND OF THE INVENTION

1. Field of the Invention

The present invention relates to a micro-mirror manufacturing method, and more particularly to a micro-mirror manufacturing method for aligning individual micro-mirror devices to a package substrate to mount them on it after dividing a plurality of micro-mirror devices formed on a wafer into them.

2. Description of the Related Art

Generally projectors using a spatial optical modulator, such as a transparent LC, a reflective LC, a micro-mirror array and the like are widely known.

The spatial optical modulator forms a bi-dimensional array on which several tens thousand to several millions of fine modulation devices are arrayed and each individual array is enlarged and displayed on a screen through a projection lens as each of pixels corresponding to an image to be displayed.

The spatial optical modulator used for a projector falls roughly into two of an LC device for modulating the polarization direction of incident light by enclosing/fixing an LC between transparent substrates and giving a potential difference between the transparent substrates and a micro-mirror device for controlling the reflection direction of illumination light by deflecting a fine micro electric mechanical systems (MEMS) mirror by electro-static power, which are generally used.

Patent Document 1 discloses one example of the micro-mirror device. In Patent Document 1, a drive circuit using a metal oxide semiconductor field-effect transistor (MOSFET) and a transformable metal mirror are formed on a semiconductor wafer substrate. This mirror can be transformed by the electro-static power of the drive circuit to change the reflection direction of incident light.

Patent Document 2 discloses an embodiment example for holding a mirror by one or two elastic hinges. When the mirror is held by one elastic hinge, the elastic hinge functions as a curved spring. When the mirror is held by two elastic hinges, the elastic hinges function as a twisted spring to deflect the reflection direction of incident light by tilting the mirror toward different directions.

The size of a mirror constituting the above-described micro-mirror device has each side of 4~20 μm and the mirror is disposed on a semiconductor wafer substrate in such a way that a space in adjacent mirror surfaces can be miniaturized as much as possible. One micro-mirror device is made by forming an appropriate number of mirror elements including these mirrors as image display elements. In this case, the appropriate number as image display elements means, for example, a number based on the resolution of a display, which is stipulated by Video Electronics Standards Association (VESA) and a number based on the TV broadcast rating.

When constituting a micro-mirror device which has a number of mirror elements, corresponding to wide extended graphics array (WXGA) (resolution: 1280×768) stipulated by VESA and a mirror pitch of 10 μm, the diagonal length of its display area is approximately 0.6 inch. Thus sufficiently small micro-mirror device is made. Therefore, when actually manufacturing micro-mirror devices, from the viewpoint of productivity improvement, a plurality of micro-mirror devices are formed on one piece of a semiconductor wafer substrate at one time and are divided into individual micro-mirror devices.

The unit of division, that is, dicing is called "die". When attention is paid to after dicing, an individual micro-mirror device separate from one piece of a semiconductor wafer substrate is sometime called "micro-mirror device die".

Since an individual mirror in such a micro-mirror device is very tiny, the attachment of a little foreign object sometimes causes a poor operation. Especially, in the dicing process of dividing a semiconductor wafer substrate into individual micro-mirror devices, sometimes a mechanical defect caused by the dicing process enters an MEMS structure to cause a poor operation and sometimes destroys the MEMS structure itself. Various methods for preventing it are disclosed.

For example, Patent Document 3 discloses a technology for forming a first sacrificial layer and a second sacrificial layer on a semiconductor wafer forming the mirror element of a micro-mirror device by a photoresist process and removing the first and second sacrificial layers by cleaning it with hydrogen Fluoride (HF) after forming a scribe line. Patent Document 4 also discloses an embodiment example of forming a protection layer on a mirror in the mirror element formed on a semiconductor wafer by a photoresist process and removing photoresist when completing the electric connection to a package substrate after dicing it. Furthermore, Patent Document 5 discloses an embodiment example of forming an organic protection layer in which resin is mixed in a solvent on an MEMS device. Furthermore, Patent Document 6 discloses an embodiment example of forming a protection layer on a mirror in a mirror element formed a semiconductor wafer by vacuum evaporation.

Here, for example, a case as described in Patent Documents 3 and 4 where the reflection surface of a mirror in the mirror device of a micro-mirror device formed on a semiconductor wafer substrate is made of aluminum and photoresist is used as the protection layer of a mirror reflection surface is assumed and studied. In this case, as a method for removing the photoresist after dividing the semiconductor wafer substrate into individual micro-mirror devices there are two methods of a dry method and a wet method.

In the dry method, burning by oxygen plasma ashes is popular. However, in the dry method, there is a possibility of disturbing its optical usage since an aluminum mirror reflection surface distorts due to an inappropriate working condition and further undergoes oxidation by the reaction between the oxygen plasma and aluminum. Therefore, it is necessary to pay sufficient attention to the setting of the working condition.

In the wet method, there is a method for removing the photoresist using a solvent whose major component is a phenol and halogen family solvent in an organic family and a method for removing the photoresist using a mixed acid, such as a sulfuric acid hydrogen peroxide mixture (SPM), a hydrochloric acid hydrogen peroxide mixture (HPM), etc., an ammonia hydrogen peroxide mixture (APM) and the like in an inorganic family. Since the former organic halogen family solvent greatly affects an environment, recently it must be avoided to use it. Since the latter inorganic family mixed acid and the like corrodes the aluminum mirror reflection surface due to a sulfuric acid, hydrochloric acid and the like included in the mixed acid, there is a possibility of deteriorating the function of a mirror.

In an example of forming a protection layer in which resin is mixed in a solvent, which is disclosed in Patent Document 5, resin coating is applied again, including the space between the mirror and the substrate after temporarily releasing the mirror. Since in this process, there is a possibility that resin coating work itself may destroys the MEMS structure, sufficient attention must be paid.

Furthermore, according to Patent Document 7, when applying resin coating to this MEMS device, the resin protection layer deforms while dividing the semiconductor wafer substrate into individual MEMS devices and as a result, it does not function as the protector of the MEMS structure. Therefore Patent Document 7 further discloses a technology for coating a harder protection layer (photoresist) over on the resin protection layer in order to solve this inconvenience. However, it has a problem that work becomes complicated and troublesome.

The micro-mirror device die separate by the above-described method is attached to a package substrate and is further covered with a transparent substrate being a lid. Thus a micro-mirror can be disposed in an almost enclosed space. Thus, a package structure in which a micro-mirror stably operates without any influences of external force, dust and the like. In this case, the semiconductor substrate of a micro-mirror device die can be also used as a package substrate.

In order to improve the function as the whole micro-mirror device die, it is preferable not only to protect the micro-mirror device die from the influences of external power and dust by package it but also to correctly dispose it in the desired position of the package substrate. It is because it is preferable to dispose a mask for shutting unnecessary light and the micro-mirror device die in correct relative positions and to simplify aligning in the case of inserting the packaged device in a device, such as a projector and the like.

Therefore, it is preferable to position the micro-mirror device on the package substrate having high accuracy and fix it.

Patent Document 8 discloses an example used to position of the two sides of a chip (that is, die) for such alignment. Patent Document 9 discloses an example of adjusting their relative positions on the basis of an optical alignment mark.

However, in Patent Document 8 it is presumed that the relative positions between the side of a chip (that is, die) and its display surface should be accurately processed. For example, if a cheap process of putting a groove and dividing by an anvil when separating dies from the wafer is adopted, it cannot be expected to obtain necessary accuracy. In the invention of Patent Document 9, one of alignment members is limited to a material through which light is transmitted and the device itself is large-scaled, which are inconveniences.

As described above, in order to stably operate a micro-mirror device it is necessary to protect it from the influences of dust, external force and the like. In order to protect it from the influences of dust, external force and the like, roughly speaking, there are two of protection in the manufacturing process of MEMS structures and protection by packaging after the completion of the MEMS structure. However, traditionally, either of these two kinds of protection has some practical difficulty or problems as described above. Therefore, a method for easily achieving these two kinds of protection without any special material and any complicated and troublesome process is desired.

Patent Document 1: U.S. Pat. No. 4,229,732
Patent Document 2: U.S. Pat. No. 4,662,746
Patent Document 3: U.S. Pat. No. 5,817,569
Patent Document 4: U.S. Pat. No. 6,720,206
Patent Document 5: U.S. Pat. No. 6,753,037
Patent Document 6: U.S. Pat. No. 6,787,187
Patent Document 7: U.S. Pat. No. 7,071,025
Patent Document 8: U.S. Pat. No. 6,649,435
Patent Document 9: U.S. Pat. No. 6,947,200

SUMMARY OF THE INVENTION

It is an object of the present invention to provide a method for easily aligning a micro-mirror device die to a package substrate relatively.

One aspect of the present invention can provide a method for aligning the micro-mirror die to the package substrate and fixing it. The method comprises a first alignment step of aligning a first guide of the micro-mirror device die to a second guide of the package substrate and a fixing step of fixing the micro-mirror device die on the package substrate in a position aligned by the first alignment step using the first and second guides.

The fixing step can also comprise a step of a protrusion into a hole. The fixing step can also comprise a support step of supporting the micro-mirror device die while maintaining its relative position against the package substrate, by touching a third guide to both the first and second guides.

According to the above-described method, the micro-mirror device die can be easily aligned to and fixed on the package substrate.

Another aspect of the present invention can provide a micro-mirror device package provided with the micro-mirror device die and the package substrate. The micro-mirror device die comprises a plurality of micro-mirror devices formed on a semiconductor substrate and a first guide. The package substrate comprises a second guide. The micro-mirror device die is fixed on the package substrate by the first and second guides.

The first and second guides can be a hole and a protrusion, respectively, or vice versa. Alternatively, the micro-mirror device package can further comprise a third guide for touching both the first and second guides and supporting the micro-mirror device package while maintaining its relative position against the package substrate.

In the above-described micro-mirror device package, the micro-mirror device die can be easily fixed on the package substrate.

BRIEF DESCRIPTION OF THE DRAWINGS

FIG. 8A is the disassembly/assembly view of the third example of the micro-mirror device package.

FIG. 8B is a disassembly/assembly view showing the state in the middle of the assembly of the third example of the micro-mirror device package.

FIG. 8C is the perspective view of the third example of the micro-mirror device package.

FIGS. 16A~16D are disassembly/assembly views showing a method for regulating the rotation of the micro-mirror device package.

DESCRIPTION OF THE PREFERRED EMBODIMENTS

Firstly, the configuration and operation of a micro-mirror device manufactured using the manufacturing method in the preferred embodiment of the present invention are described.

Figure 1:
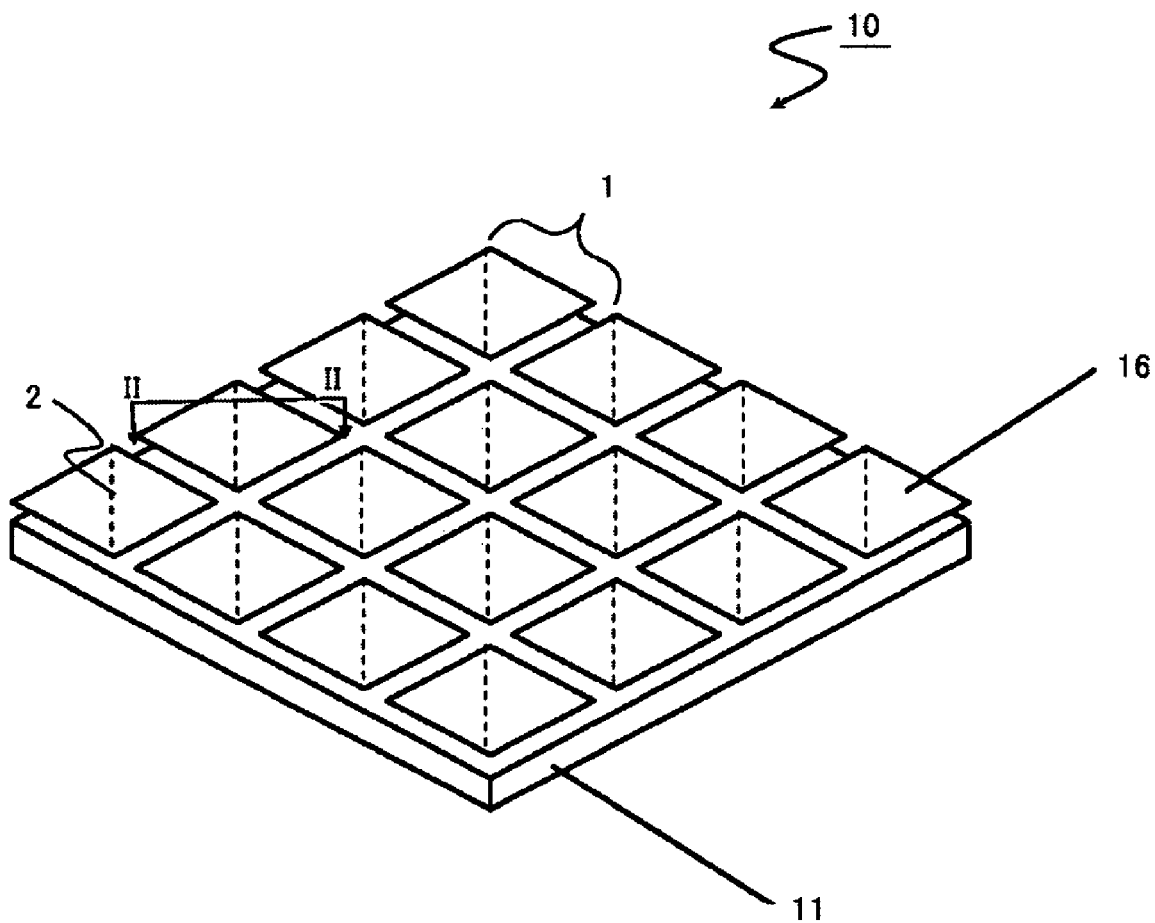
FIG. 1 is a perspective view showing one example of one micro-mirror device in which a plurality of mirror elements are bi-dimensionally disposed on a semiconductor wafer substrate.

FIG. 1 shows one example of a micro-mirror device 10 in which a plurality of mirror elements 1 are bi-dimensionally disposed on a semiconductor wafer substrate.

As shown in FIG. 1, basically the micro-mirror device 10 is formed by disposing the micro-mirror element 1 composed of an address pole, which is not shown in FIG. 1, an elastic hinge, which is not shown in FIG. 1, and a mirror 16 supported by the elastic hinge on the substrate bi-dimensionally vertically and horizontally. In a general micro-mirror device, the mirror is controlled assuming as if the address poles in one mirror element are two. In FIG. 1, a deflection axis 2 for deflecting a mirror surface is shown by a broken line.

Figure 2A:
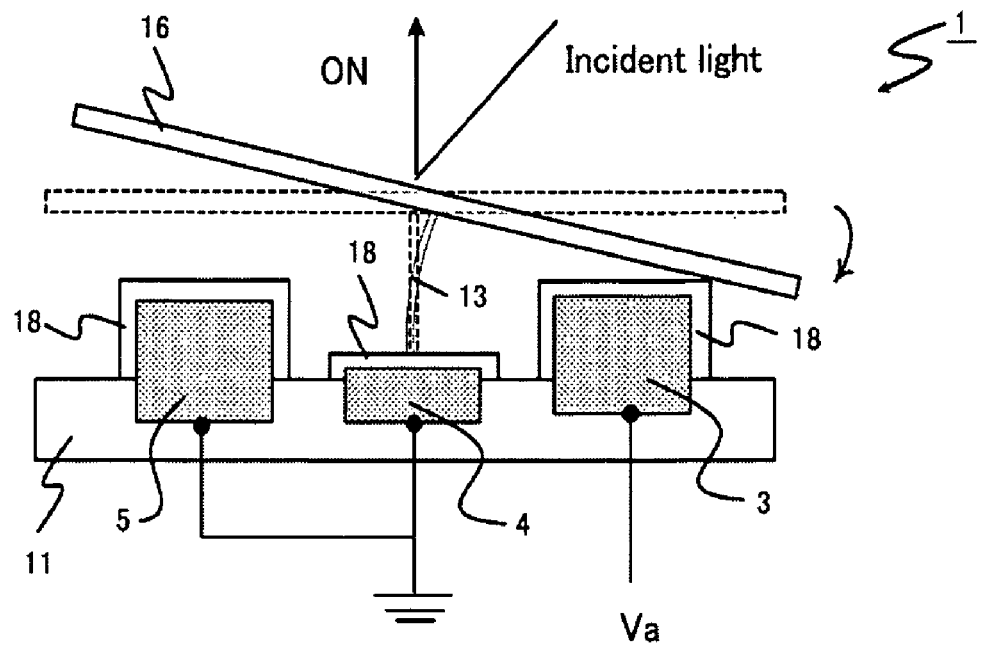
FIG. 2A is a cross section view separate by a line II-II in the optical ON state of a mirror element shown in FIG. 1.
Figure 2B:
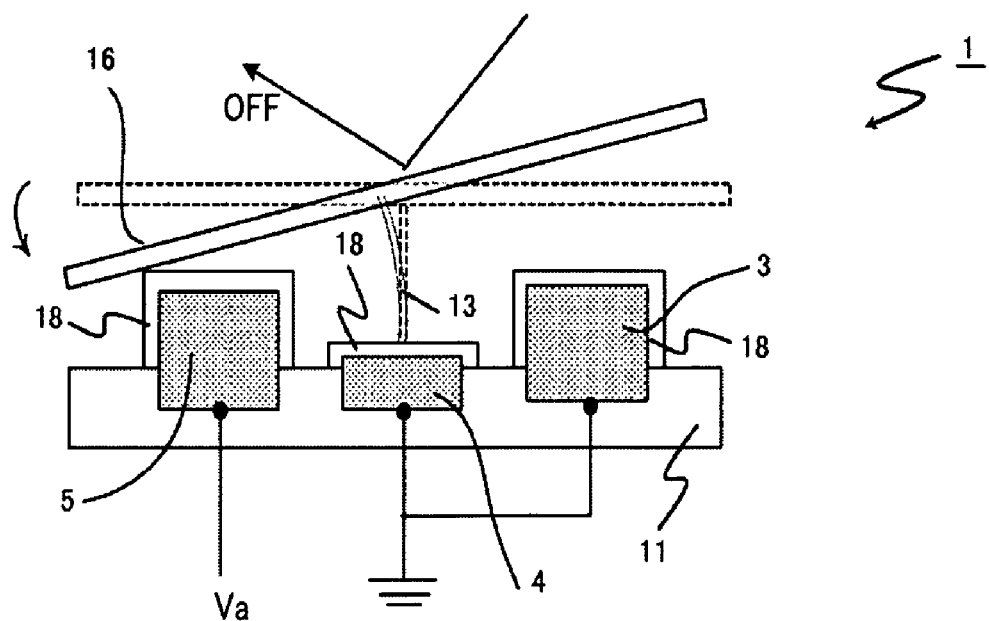
FIG. 2B is a cross section view separate by a line II-II in the optical OFF state of a mirror element shown in FIG. 1.

The configuration of one mirror element 1 in a general micro-mirror device 10 is described below with reference to FIG. 2A. FIGS. 2A and 2B are cross section views at the line II-II of the mirror element shown in FIG. 1.

An address pole 3 for driving a mirror is provided on a semiconductor wafer substrate 11 including a drive circuit, which is not shown in FIG. 1, for driving the mirror 16 in the configuration of one mirror element 1 in a micro-mirror device. The mirror 16 is held above the address pole 3 by an elastic member 13 connected to the semiconductor wafer substrate 11. In this case, a hinge pole 4 connected to the elastic member 13 is grounded.

Each of the address poles 3 is electrically connected to the drive circuit and a potential difference is generated between it and the mirror 16 by receiving a control signal. Thus the deflection direction of the mirror 16 can be controlled by static power as shown in FIG. 2A. An insulation protection layer 18 is provided on the address pole 3 to prevent short-circuiting from occurring even if the mirror tilts and touches the address pole 13. Thus one mirror element of the general micro-mirror device is structured. One micro-mirror device 10 can be made by disposing a plurality of the above-described mirror elements on the semiconductor wafer substrate 11 in the shape of a bi-dimensional array as shown in FIG. 1.

Concerning the material of each component of the mirror element, for example, the mirror 16 is made of a metal of high reflectance. All or a part (for example, a joint, a neck and a middle) of the elastic member 13 supporting the mirror 16 are made of a metal having restoring power, silicon, ceramic and the like. FIG. 2A shows a case where the elastic member 13 is of cantilever type and has elasticity by which the mirror 16 can be freely vibrated. For the conductor of the address pole 3, aluminum (Al), copper (Cu), tungsten (W) or the like is used. For an insulation layer 18, silicon dioxide ($SiO_2$), silicon carbide (SiC) or the like can be used. For the semiconductor wafer substrate 11, silicon (Si) can be used.

Furthermore, the control of one mirror element 1 shown in FIG. 1 in an optical ON state where incident light is reflected to a prescribed optical projection path is briefly described with reference to FIG. 2A.

In FIG. 2A, clone force F can be acted between the address pole 3 and the mirror 16 by applying voltage to the address pole 3 in the initial state where no voltage is applied to the address pole 3 and the mirror 16 is horizontal and the mirror 16 can be deflected by approaching the mirror 3 to the address pole 3. Thus, by applying voltage to the address pole 3 and deflecting the mirror surface up to a prescribed inclination angle, incident light can be modulated to "ON light" which reflects on a prescribed projection path.

Next, FIG. 2B is the cross section view of a mirror element shown in FIG. 1 obtained when modulating incident light to "OFF light" which does not reflect on the projection path.

In FIG. 2B, according to the same theory as shown in FIG. 2A, by deflecting the mirror surface to an inclination angle other than one by which light reflected on the mirror surface becomes ON light by applying voltage to the other address pole 5 different from one shown in FIG. 2A, incident light can be made OFF light which does not reflects on the projection path.

Therefore, by independently controlling each mirror element 1 corresponding to each pixel constituting an image according to the data of the image, incident light to the micro-mirror device 10 can be spatially optically-modulated and a specified image can be displayed on a screen or the like.

Then, the preferred embodiment of a method for manufacturing the micro-mirror device 10 composed by the mirror element 1 including the above-described deflectable mirror 16 and dividing a plurality of micro-mirror devices formed on the semiconductor wafer substrate 11 is described in detail. The micro-mirror device in the following preferred embodiment is not limited to the above-described general micro-mirror device and applies to the whole micro-mirror device, which is clear from the following description.

Next, a method for easily manufacturing a mirror element 1 having an MEMS structure while protecting it from the influence of dust and the like is described. Although the details of the manufacturing method are described with reference to FIGS. 3A through 4 later, its summary is as follows.

The micro-mirror manufacturing method provided by the following preferred embodiment has the following features in view of the above-described problems accompanying the traditional method.

(1) The mirrors of a plurality of micro-mirror devices formed on the semiconductor wafer substrate are protected by an inorganic protection layer.

(2) The influence of the removal work on the mirror reflection surface after dividing it into individual micro-mirror device is reduced.

(3) The protecting and manufacturing processes are easy.

The micro-mirror manufacturing method in the following preferred embodiment separates a micro-mirror device composed of mirror elements including deflectable mirrors from a wafer. The manufacturing method comprises a step of depositing an inorganic protection layer on a mirror before dividing individual micro-mirror devices from the wafer and a step of removing the inorganic protection layer after dividing individual micro-mirror devices from the wafer.

In this case, it is preferable for the inorganic protection layer to be a silicon compound.

It is preferable for the inorganic protection layer to be $SiO_2$ or SiC.

It is preferable for the inorganic protection layer to be removed by HF.

It is preferable for the inorganic protection layer to be removed by dry edging.

It is ideally preferable for a sacrificial layer used to provide a space above the wafer and to form a mirror to be the same material as the inorganic protection layer.

The micro-mirror manufacturing method can also further comprise a step of dividing individual micro-mirror devices from a wafer in the environment of being equal or lower than the melting point of the inorganic protection layer and a step of removing the inorganic protection layer by exposing it in the environment of being higher than the melting point of the inorganic protection layer after dividing individual micro-mirror devices from the wafer.

In the micro-mirror manufacturing method, it is preferable to form a groove which becomes a reserve for separating when removing a part of the inorganic protection layer by edging and dividing individual micro-mirror devices from the wafer.

Furthermore, it is preferable to provide at least one auxiliary member in order to maintain the arrangement before dividing individual micro-mirror devices from the wafer on the back of the wafer.

The micro-mirror manufacturing method can also further comprise a step of providing at least one auxiliary member in order to maintain the arrangement before dividing individual micro-mirror devices from the wafer on the back of the wafer and a step of removing the auxiliary member after dividing individual micro-mirror devices from the wafer.

The micro-mirror manufacturing method can also further comprise a step of processing an opening whose relative position between a package and the mirror is finely determined on the bottom of the wafer before dividing individual micro-mirror devices from the wafer.

Furthermore, ideally the inorganic protection layer can be made of the same material as the sacrificial layer for forming a mirror, and the sacrificial layer and the protection layer can be also removed by the same etchant in the same process.

As its summary has been described above, the following preferred embodiment provides a micro-mirror manufacturing method for dividing a plurality of micro-mirror devices formed on a wafer into individual micro-mirror devices while protecting it.

Figure 3A:
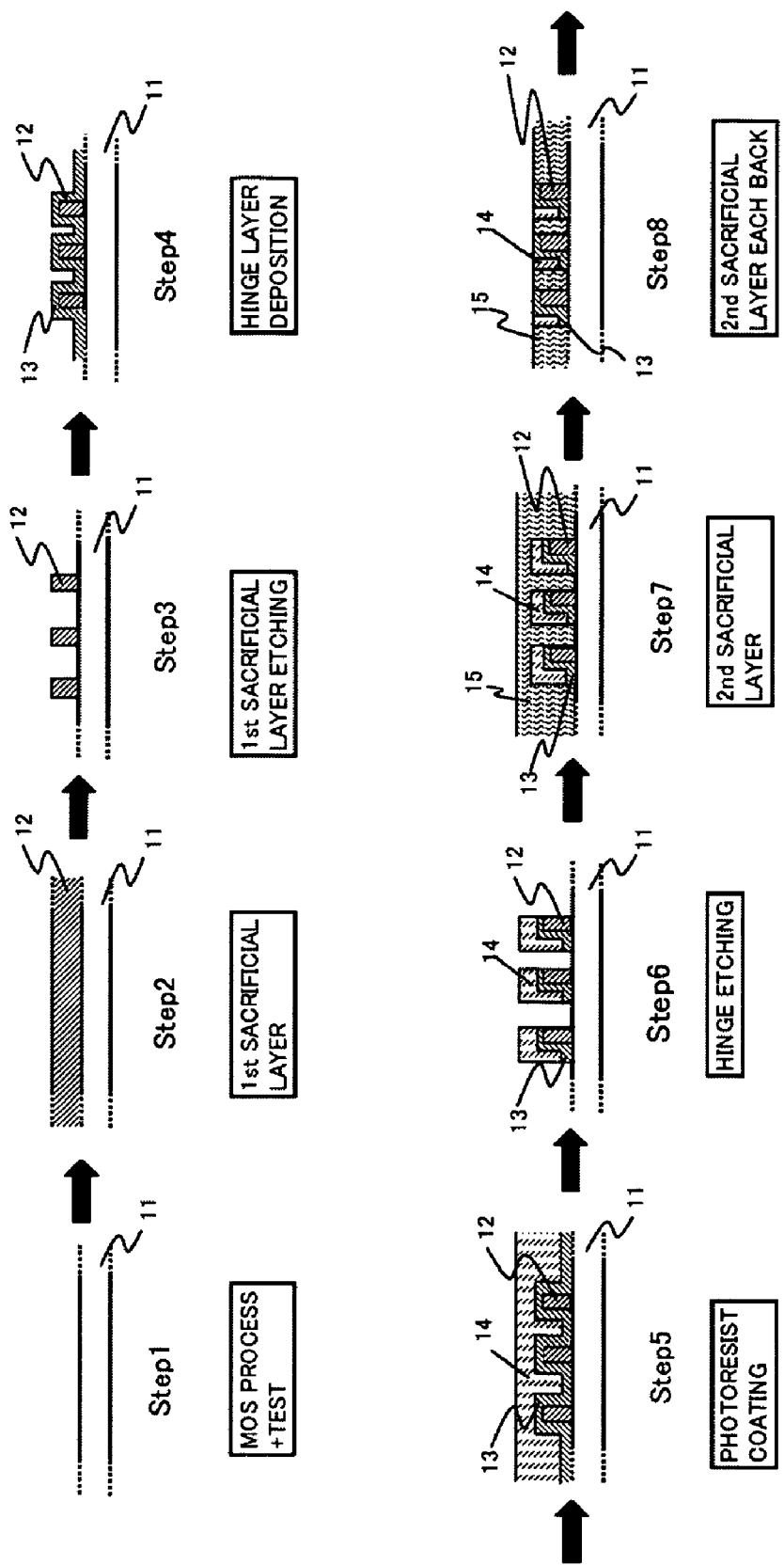
FIGS. 3A and 3B are cross section views showing the summary of a micro-mirror manufacturing process in one embodiment.
Figure 3B:
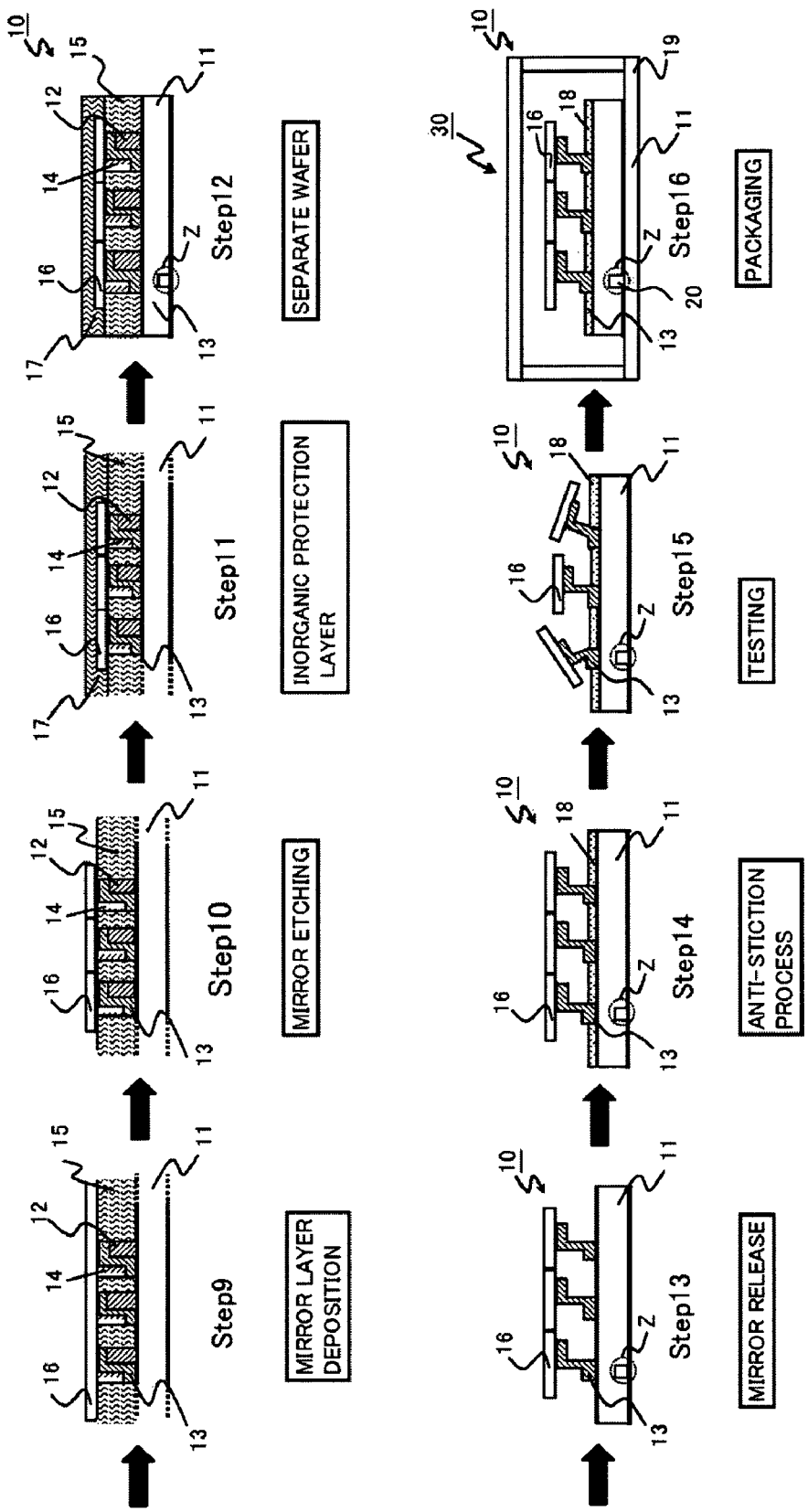

As one example of the preferred embodiment of the micro-mirror manufacturing method, the summary of the process for dividing a plurality of micro-mirror devices 10 formed on the semiconductor wafer substrate 11 while protecting it and manufacturing one micro-mirror device 10 is described below with reference to FIGS. 3A and 3B. FIGS. 3A and 3B are the cross section views of micro-mirror manufacturing showing the summary of the micro-mirror manufacturing process.

FIGS. 2A and 2B shows each component of the completed mirror element and FIGS. 3A and 3B shows the material of each component. In FIGS. 3A and 3B, the same reference numeral as the completed component is attached to the material of each component.

In step 1 shown in FIG. 3A, a drive circuit, which is not shown in FIG. 2, for driving a mirror and an address pole, which is not shown in FIG. 2, connected to the drive circuit are formed on the semiconductor wafer substrate 11. Then, it is checked whether there is no abnormality in the operation of the drive circuit and the conductivity of the address pole by testing the drive circuit formed on the semiconductor wafer substrate 11. If there is no abnormality in the drive circuit and the pole, the flow proceeds to step 2.

In step 2 shown in FIG. 3A, a first sacrificial layer 12 is deposited on the semiconductor wafer substrate 11 on which the drive circuit and the pole are formed. This first sacrificial layer 12 is used to provide a space above between a mirror surface formed in a later step and the semiconductor wafer substrate 11 and for it, $SiO_2$ or the like is used. In this preferred embodiment, the thickness of this first sacrificial layer 12 determines the height of the elastic hinge for supporting a mirror. The first sacrificial layer 12 used to provide a space above between the semiconductor wafer substrate 11 and the mirror can be also made of the same material as the inorganic protection layer described later.

The sacrificial layer in this preferred embodiment is deposited on the semiconductor wafer substrate 11, for example, by a method called "chemical vapor deposition (CVD)". The chemical vapor deposition is a method for placing a wafer in a chamber, a supplying a material according to the kind of a sacrificial in gaseous form and depositing a film utilizing a chemical catalytic reaction. The $SiO_2$ in this preferred embodiment can be also formed by a thermal oxidation method for placing a silicon wafer in an oxidation furnace of high temperature and growing a $SiO_2$ film by oxidizing silicon.

Then, in step 3 shown in FIG. 3A, a part of the first sacrificial layer 12 is removed by etching and determining the height and shape of an elastic member 13 formed in a later process.

In step 4 shown in FIG. 3A, the elastic member 13 including a joint for connecting it to a semiconductor wafer substrate on the semiconductor wafer substrate 11 and the first sacrificial layer 12 formed in step 3 is deposited. In this preferred embodiment, this elastic member 13 forms the elastic hinge supporting a mirror later and is made of Si and the like. The final thickness of the elastic hinge is determined by adjusting the deposited amount of the elastic member 13 in this process.

Then, in step 5 shown in FIG. 3A, photoresist 14 is deposited on a structure formed on the semiconductor wafer substrate 11 in the former steps 2~4.

In step 6 shown in FIG. 3A, a desired structure shape is obtained by exposing the photoresist 14 using a mask for transcribing the desired structure shape and then etching the elastic member 13 deposited on the semiconductor wafer substrate 11. The elastic member 13 deposited on the semiconductor wafer substrate 11 in steps up to 5 of this process is divided into individual elastic hinges corresponding to individual mirrors in the mirror element of the micro-mirror device.

In step 7 shown in FIG. 3A, the second sacrificial layer 15 is further deposited on the structure deposited in step 6 shown in FIG. 3A, in steps up to 6. The second sacrificial layer 15 can be made of the same material as the first sacrificial layer. In this preferred embodiment, it is assumed that for the material, $SiO_2$ is used. In this case, the material is deposited at least higher than the top of the elastic hinge.

Then, in step 8 shown in FIG. 3A, the photoresist 14 and the second sacrificial layer 15 deposited on the semiconductor wafer substrate 11 in steps up to 7 is polished until the top of the elastic member 13 being the elastic hinge is exposed. Alternatively, the photoresist 14 can be removed once after etching the elastic member 13 in step 6 and in step 8, the first sacrificial layer 12 and the elastic member 13 can be covered with only the second sacrificial layer 15.

Then, in step 9 shown in FIG. 3B, a mirror layer 16 is deposited on the top of the photoresist 14 and the elastic member 13 posed in step 8. For this mirror layer 16, aluminum (Al), gold (Au), silver (Ag) or the like is used. Furthermore, in this process, a mirror support layer made of a material different from a mirror material can be also formed between the mirror layer 16 and the elastic member 13 to support the mirror layer 16 to reinforce the connection with the elastic hinge or make a mirror difficult to be fixed on a stopper when deflecting the mirror.

In this case, the stopper is used to regulate the deflection angle of the mirror. In the examples shown in FIGS. 2A and 2B, the address poles 3 and 5 that are covered with the insulation protection layer 18 protruded from and formed on the semiconductor wafer substrate 11 are also used as the stoppers. In the example shown in FIG. 2A, the range of the deflection angle of the mirror 16 is regulated by an angle at which the mirror 16 touches the address pole 3 and an angle at which the mirror 16 touches the address pole 5.

For the mirror support layer, titanium (Ti), tungsten (W) or the like is used.

Then, in step 10 shown in FIG. 3B, photoresist, which is not shown in FIG. 2, is coated on the mirror layer 16 formed in step 9 and the mirror layer 16 is divided into individual mirrors 16 after exposing a mirror pattern using a mask to shape the mirror 16.

In this process, since the first sacrificial layer 12, the photoresist 14 and the second sacrificial 15 still exist on the bottom of the mirror 16, no external force is applied to the elastic member 13. Although individual micro-mirror devices can be traditionally separate from the semiconductor wafer substrate 11 in the state of such a formed structure, it is preferable to further a protection layer is formed on the top of the mirror layer from the viewpoint of preventing the deterioration of reflectance due to the attachment of a foreign object on the top of the mirror layer or a defect on it. It is also preferable to form the protection layer in the sense of preventing bad influences on the mirror surface, due to manual work, such as the storage, movement and the like of the semiconductor wafer substrate 11.

Therefore, in this preferred embodiment, in step 11 shown in FIG. 3B, an inorganic protection layer 17 made of a silicon compound is further formed on the top of the mirror 16 in the structure on the semiconductor wafer substrate 11 formed in steps up to 10. It is ideally preferable to deposit the same $SiO_2$ as the first sacrificial layer 12 and the second sacrificial layer 15 as this inorganic protection layer 17.

Since this $SiO_2$ is transparent, the mirror surface can be observed in a state where the inorganic protection layer 17 attached to it and the inorganic protection layer 17 can be also used as a protection layer when performing the appearance inspection of the mirror 16. The inorganic material used for the inorganic protection layer 17 is not limited to $SiO_2$ and for example, SiC or the like can be also used.

By further depositing the inorganic protection layer 17 on the mirror layer 16 thus, the mixture of a foreign object into the elastic member 13, the destroy of the elastic member 13, the attachment of a foreign object to the mirror 16, and the generation of a defect in the mirror 16 caused when dicing in order to divide a plurality of micro-mirror devices formed on the semiconductor wafer substrate 11 into individual micro-mirror devices can be prevented. It is preferable to apply etching to the second sacrificial layer 15 and the inorganic protection layer 17, providing a scribe groove for dividing individual micro-mirror devices from the semiconductor wafer substrate 11 in a subsequent process and exposing the semiconductor wafer substrate 11 after forming the inorganic protection layer 17 in the top of the mirror layer 16.

Then, in step 12 shown in FIG. 3B, the plurality of micro-mirror devices obtained in step 11 by forming a structure covered with the inorganic protection layer 17 on the semiconductor wafer substrate 11 is divided into individual micro-mirror devices. In the drawings of steps 1~11, it is shown that portions corresponding to other micro-mirror device 10, which is not shown in FIG. 3, exist around by showing the left and right ends of the semiconductor wafer substrate 11 by broken lines. In the drawings of steps 12 and after, the left and right ends of the semiconductor wafer substrate 11 are closed by solid lines in order to show only one micro-mirror device 10 obtained in the dicing process.

Figure 4:
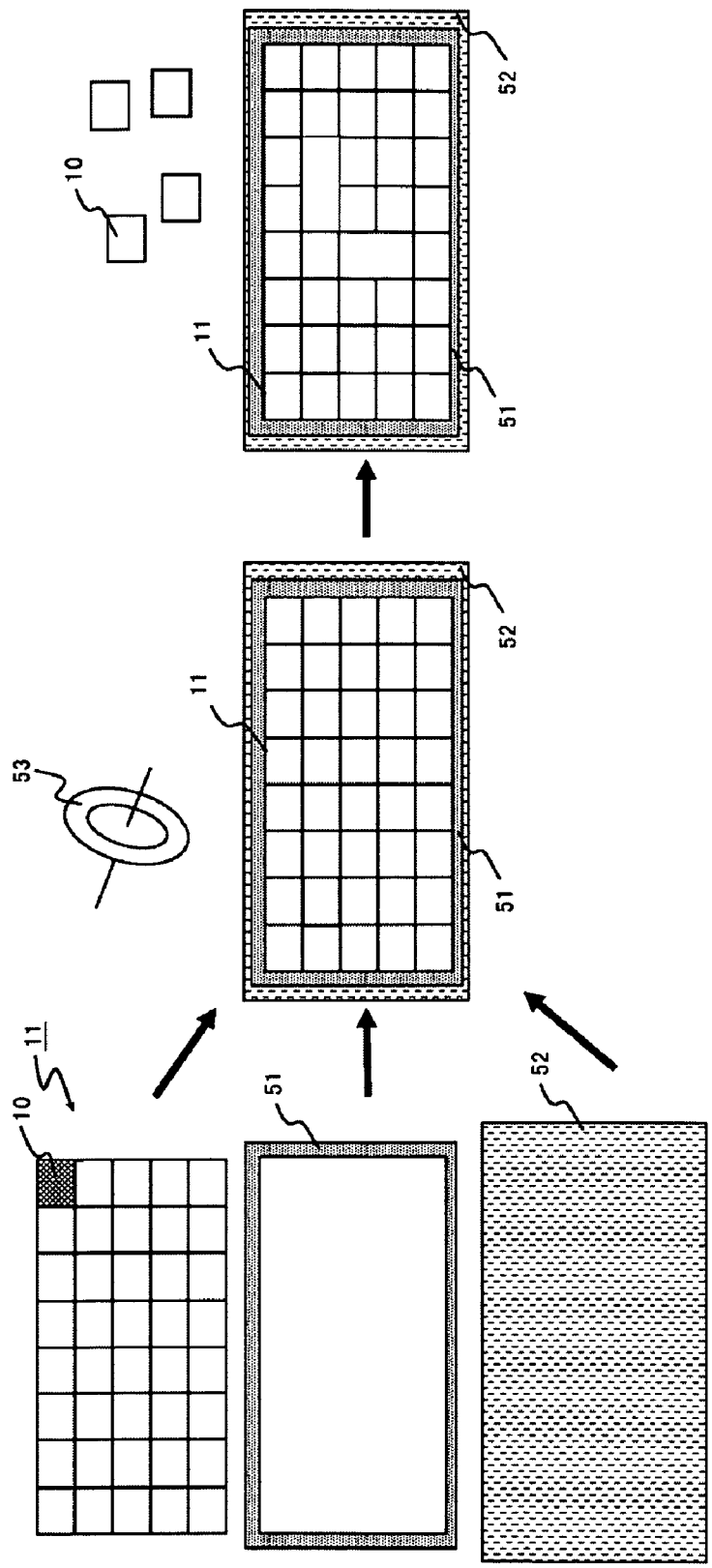
FIG. 4 shows the summary of a dicing method for dividin- spacelurality of micro-mirror devices on a wafer, using an UN tape for maintaining the arrangement before dividing it into individual micro-mirror devices on the back of the semiconductor wafer substrate.

The dicing process of separating individual micro-mirror devices 10 from the left and right ends of the semiconductor wafer substrate 11 in step 12 can be performed, for example by a method as shown in FIG. 4. In the dicing method shown in FIG. 4, at least one auxiliary member is used to prevent individual micro-mirror devices 10 separate from the semiconductor wafer substrate 11 from scattering during dicing. Specifically, in the dicing method shown in FIG. 4, at least one auxiliary member for maintaining the same arrangement as before dividing a plurality of micro-mirror devices on the at least one auxiliary member into individual micro-mirror devices after it is used.

In this preferred embodiment shown in FIG. 4 a special tape (ultraviolet (UV) tape) 52 vanishing adhesiveness by ultra violet radiation generally known in a semiconductor process is used as one auxiliary member of this.

In the dicing process shown in FIG. 4, firstly the whole semiconductor wafer substrate 11 to the back of which the above-described UV tape is attached is fixed to the dicing frame 51 after attaching the UV tape 52 to the back of the semiconductor wafer substrate 11 having a plurality of micro-mirror devices and the semiconductor wafer substrate 11 is separate using a round blade called diamond saw 53. By expanding the UV tape after separating individual micro-mirror devices 10 from the semiconductor wafer substrate 11, the separate micro-mirror devices 10 are pulled together with the UV tape 52 to generate a space and to completely divide it into individual micro-mirror devices 10.

Then, when UV light is applied to the back of the completely divided individual micro-mirror devices 10, its viscosity is lost and the micro-mirror devices 10 are easily separated from the UV tape 52. The appearance inspection of the completely divided individual micro-mirror devices 10 can be also conducted before and after the separation from the UV tape 52, using a microscope and the like.

In the dicing process, instead of the above-described separating by the diamond saw 53, they can be also separate by laser by high-pressured water stream, by further etching their scribe lines using another etchant, by reducing the semiconductor wafer substrate 11 after forming scribe lines or the like.

Here the description returns to step 12 shown in FIG. 3B. In step 12, it is further preferable to provide an opening Z on the bottom of the semiconductor wafer substrate 11. The opening Z is used to optimally fit the position of a mirror to the position corresponding to the mirror position of a package for storing the completed micro-mirror devices each other. Specifically, in step 12, the mirror is already formed and its position is determined. Therefore, it is preferable to provide an opening Z on the bottom of the semiconductor wafer substrate 11 on which the inorganic protection layer 17 is deposited in order to finely determine the relative position between the mirror 16 and the package. The opening Z can also pass through the semiconductor wafer substrate 11. Although it is preferable to form this opening Z on the structure of the semiconductor wafer substrate 11 on which the inorganic protection layer 17 is deposited in step 12, it can be also formed in a later step.

Then, step 13 shown in FIG. 3B, the elastic member 13 and the mirror 16 which are protected by each layer is made deflectable by removing the first sacrificial layer 12, the photoresist 14, the second sacrificial layer 15 and the inorganic protection layer 17 by an appropriate etchant (such as HF etc.). Thus the elastic member 13 and the mirror 16 can be formed on the semiconductor wafer substrate 11 and they can be deflected by the drive circuit and the pole. The first sacrificial layer 12, the second sacrificial layer 15, the inorganic protection layer 17 and the photoresist 14 can be removed by any of dry etching and wet etching. However, in order to prevent a stiction problem from occurring, it is preferable to remove these sacrificial layers by dry etching.

In step 14 shown in FIG. 3B, an anti-stiction process is performed in order to prevent the movable portion from being fixed, specifically, the mirror from continuing to touch the pole to prevent the mirror from being normally controlled. In this process of this preferred embodiment, a new layer 18 is deposited on the address pole and the like of the semiconductor wafer substrate 11.

In this preferred embodiment, the layer provided for the purpose of anti-stiction is also used as the insulation protection layer 18 shown in FIGS. 2A and 2B. In FIGS. 3A and 3B, since the address pole is not shown, the layer 18 is shown flat. However, for example, as shown in FIGS. 2A and 2B, the address poles 3 and 5 can be also protruded from the surface of the semiconductor wafer substrate 11. In that case, in step 14, the layer 18 is formed in such a way as to cover the protruded address poles 3 and 5.

Then, in step 15 shown in FIG. 3B, the operation inspection of the individual micro-mirror devices 10 separate from the semiconductor wafer substrate 11 is conducted after the unstinction process.

Lastly, in step 16 shown in FIG. 3B, only the micro-mirror devices which passes the operation inspection in step 15 are selected and enclosed in a package 19 for storing one completed micro-mirror device 10 to produce one micro-mirror device package 30.

In this case, a protrusion 20 can be also further provided for the package 19 in order to appropriately fit the mirror position to the position of a package 19 corresponding to the mirror position. As described above, an opening Z is provided on the bottom of the semiconductor wafer substrate 11 in order to finely determine the relative positions between the mirror 16 and the package 19 in the micro-mirror device 10. Therefore, a package 19 provided with a protrusion 20 which is finely aligned to fit the opening Z can be also used. By fitting the opening Z on the bottom of the semiconductor wafer substrate 11 to the protrusion 20 of the package 19 in this micro-mirror device 10, the position of the mirror 16 in the package 19 can be accurately determined.

Specifically, the micro-mirror device 10 can be aligned to the package 19 having high accuracy by the opening Z and the protrusion 20 which are provided in their respective positions determined with high accuracy. Therefore, the relative positions between an individual mirror 16 and the package 19 can be also determined with high accuracy. Such highly accurate alignment contributes to improve the overall function of the micro-mirror device package 30. For example, the reasons are as follows.

For example, the package 19 not only protects the micro-mirror device 10 but also shuts out unnecessary light by providing a mask and the like. In this case, if the accuracy of the alignment of the micro-mirror device 10 and the package 19 is low, unnecessary light may not enter a certain mirror 16. Alternatively, necessary light may be shut out and may not reach another certain mirror 16. As a result, sometimes a specified image is not accurately projected. Specifically, the accuracy of the alignment of the micro-mirror device 10 and the package 19 affects the overall function of the micro-mirror device package 30.

As shown in FIG. 3B, the micro-mirror device 10 (that is, micro-mirror device die) can be aligned to the package 19 with high accuracy by the opening Z and the protrusion 20. Various structures other than the structure exemplified in FIG. 3B can be also used to position them. Therefore, various examples of the micro-mirror device package, adopting those various structures are described below with reference to FIGS. 5~17.

Figure 5:
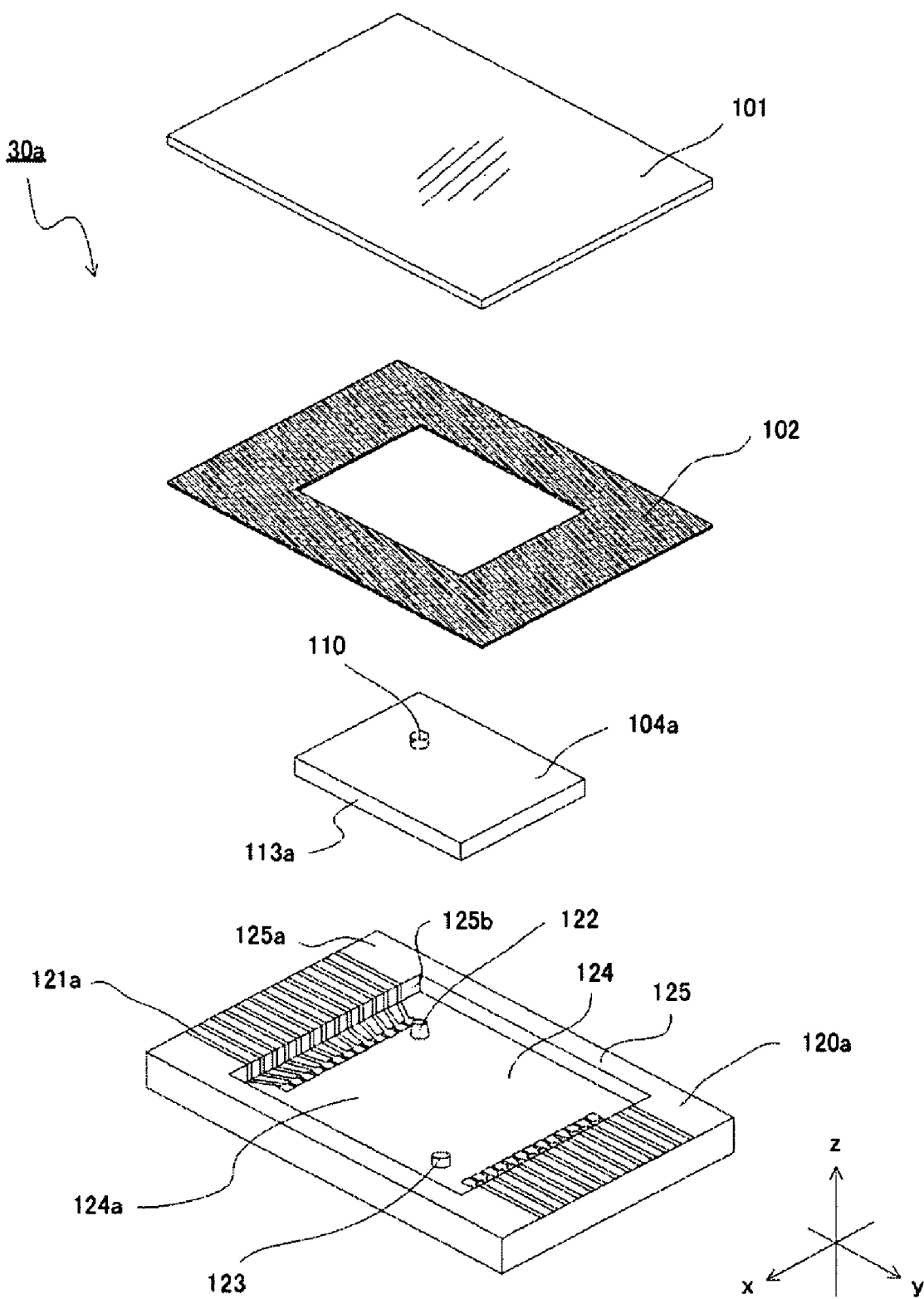
FIG. 5 is the disassembly/assembly view of the first example of the micro-mirror device package.

FIG. 5 is the disassembly/assembly view of the first example of the micro-mirror device package. Although in FIG. 5 the coordinate axes of a xyz coordinate system are shown, in the following description, it is assumed that z axis is a vertical axis for convenience of description.

The micro-mirror device die 104a shown in FIG. 5 corresponds to the micro-mirror device 10 after the dicing process, shown in FIG. 3B. In FIG. 5, the individual mirror elements 1 of the micro-mirror device die 104a are not shown.

In FIG. 5, the package 19 shown in FIG. 3B comprises a window 101, a mask 102 and a package substrate 120a.

The window 101 is a flat member made of a material through which light transmits.

The mask 102 is a flat member made of a material which shuts out unnecessary light. The center of the mask 102 is torn off in the shape of a rectangle. In this preferred embodiment, the size of the torn portion is almost equal to that of the top of the micro-mirror device die 104a.

A concavity 124 which is dented further than a fringe 125 is formed on the package substrate 120a.

By placing the micro-mirror device die 104a on the concavity 124 and covering the mask 102 and the window 101 over the micro-mirror device die 104a, the micro-mirror device die 104a is packaged to produce a micro-mirror device die 30a.

Since the packaged micro-mirror device die 104a is almost sealed, it is protected from dust and the like. Since the packaged micro-mirror device die 104a is enclosed the package substrate 120a, the mask 102 and the window 101. it is also protected from external force.

As described above, the package substrate 120a accommodates the micro-mirror device die 104a in the concavity 124, holds it and protects it. Furthermore, the package substrate 120a provides an electrical connection between the package substrate 120a and an external power supply.

More particularly, in FIG. 5 a conductive pattern 121a is formed along the surface of the package substrate 120a from the top 125a of the fringe 125 until the base 124a of the concavity 124 via the side 125b which is a boundary between the fringe 125 and the concavity 124. Therefore, by electrically connecting the micro-mirror device 104 and the conductive pattern 121a placed on the concavity 124 and conductive pattern 121a connecting the conductive pattern 121a to an external power supply, the micro-mirror device die 104a can be connected to the external power supply through the package substrate 120a.

As described with reference to FIG. 3B, when packaging the micro-mirror device die 104a, it is preferable to finely position (that is, with high accuracy) the micro-mirror device die 104a and the package substrate 120a.

In the example shown in FIG. 5, in order to position them, a hole 110 formed on the bottom, which is not shown in FIG. 5, of the micro-mirror device die 104a, and the protrusion in the shape of a shaft and a rotation stopper 123 which are formed on the base 124a of the concavity 124 of the package substrate 120 are used.

The micro-mirror device package 30a is assembled, namely the micro-mirror device die 104a is packaged as follows by an assembly device, such as a robot having a handle etc., a human worker or the like. For convenience of description, the case where it is mounted by the assembly device is described as an example.

The assembly device holds the micro-mirror device die 104a above the package substrate 120a and the micro-mirror device die 104a is moved up to a position where the x and y coordinates of the hole 110 coincide with those of the protrusion 122, respectively. Thus the hole 110 and the protrusion 122 are positioned. The hole 110 and the protrusion 122 function as its alignment guide portions.

The assembly device not only matches the x and y coordinates of the hole 110 with those of the protrusion 122, respectively, but also matches the direction of the micro-mirror device die 104a with that of the package substrate 120a. In this case, the inclination on the xy plane of the side 113a of the micro-mirror device 104a and the x and y coordinates of the rotation stopper 123 are referenced as guide portions for matching their direction with each other.

Then, the assembly device moves the micro-mirror device 104a downward horizontally along the z axis to fit the protrusion into the hole 110. Thus the micro-mirror device 104a is fixed on the package substrate 120a. Specifically, the micro-mirror device die 104a is fixed on the package substrate 120a by the hole 110 and protrusion 122 which are its guide portions.

However, there is a possibility that the micro-mirror device die 104a fixed on the package substrate 120a only by the fitting by the hole 110 and the protrusion 122 may rotate relatively against the on the package substrate 120a with the position of the hole 110 as the center. The possibility of the rotation sometimes cannot be neglected depending on the shapes and materials of the hole 110 and the protrusion 122.

Therefore, in the example shown in FIG. 5, the rotation stopper 123 for limiting the rotation of the micro-mirror device die 104a against the package substrate 120a is provided in the concavity 124 to prevent the rotation of the micro-mirror device die 104a. The position and shape of the rotation stopper 123 is determined in such a way that the side of the rotation stopper 123 touches the side 113a of the micro-mirror device die 104a when the micro-mirror device die 104a is fixed on the package substrate 120a in a correct direction. The rotation stopper 123 is formed in a specific position on the base 124a of the concavity 124 in a specific shape.

According to the installation direction of the micro-mirror device package 30a in an actual environment in use, sometimes it is sufficient to provide only one rotation stopper 123 for limiting the rotation in a specific direction considering the rotation in the specific direction, caused by gravity. Therefore, as shown in FIG. 5, only one rotation stopper 123 can be also provided on the package substrate 120a. Depending on a preferred embodiment, a plurality of rotation stoppers can be also provided on the package substrate 120a.

Although the hole 110 shown in FIG. 5 is not a trough hole, it can be also a trough hole.

As described above, when fixing the micro-mirror device die 104a on the package substrate 120a, the hole 110, the protrusion 122 and the rotation stopper 123 regulates the relative position and direction of the micro-mirror device die 104a against the package substrate 120a. Therefore, it is preferable to determine any of the position of the hole 110 in the micro-mirror device die 104a and the positions of the protrusion 122 and the rotation stopper 123 on the package substrate 120a with high accuracy.

For example, the package substrate 120a is made of glass, silicon, ceramic and the like. In order to form the protrusion 122 and the rotation stopper 123 in specific positions with high accuracy, a process by horning, laser separating, blast, minting, grinding, milling or the like is suitable.

Although the hole 110 opened on the semiconductor wafer substrate 11 of the micro-mirror device die 104a can be formed by the same process method, preferably the hole should be processed and formed by etching. When etching the hole 110, the hole 110 can be also processed using a photo mask in the same process as the formation of the mirror 16. In this case, the accuracy of the relative position against the mirror element 1 can be easily improved.

Figure 6:
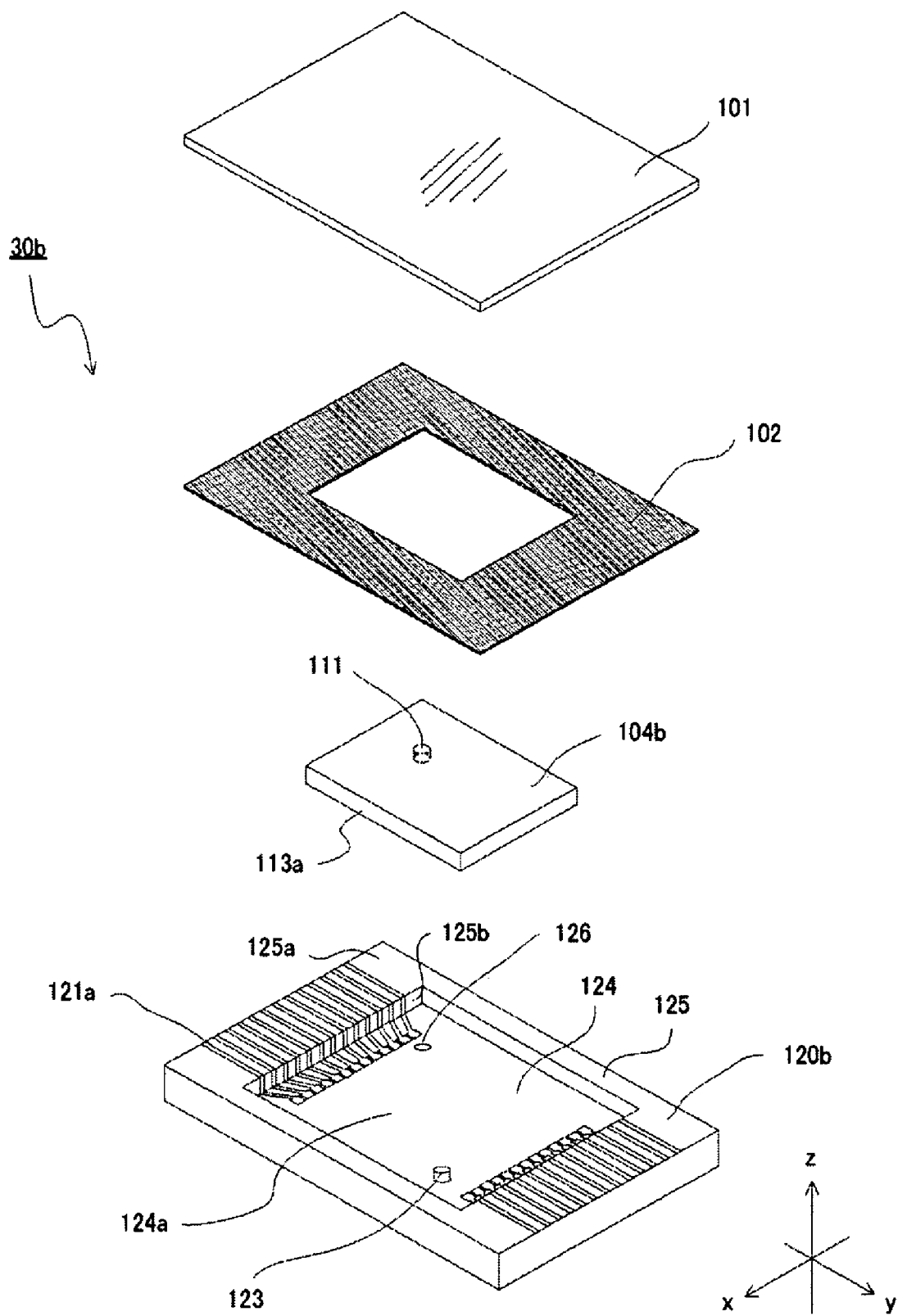
FIG. 6 is the disassembly/assembly view of the second example of the micro-mirror device package.

Next, the second example of the micro-mirror device package is described with reference to FIG. 6. FIG. 6 is the disassembly/assembly view of the second example of the micro-mirror device package.

Since FIGS. 5 and 6 have many common points, their differences are centered in the following description. The example shown in FIG. 6 differs from that shown in FIG. 5 only in that a protrusion 111 in the shape of a shaft is formed on the bottom, which is not shown in FIG. 6, of the micro-mirror device die 104b instead of the hole 110 and a hole 126 is formed on the base 124a of the concavity 124 of the package substrate 120b instead of the protrusion 122.

The protrusion 111 can be also formed by a photolithography process. Alternatively, it can be formed by the same process method as the protrusion 122 and the rotation stopper 123 which are shown in FIG. 5.

The assembly of a micro-mirror device package 30b shown in FIG. 6 differs from that shown in FIG. 5 as follows.

The protrusion 111 and the hole 126 function as its alignment guide portions.

The assembly device holds a micro-mirror device die 104b above a package substrate 120b and moves the micro-mirror device die 104b up to a position where the x and y coordinates of the protrusion 111 coincides with those of the hole 126. Thus the protrusion 111 and the hole 126 are positioned.

In order to fix the micro-mirror device die 104b on the package substrate 120b, the assembly device moves the micro-mirror device die 104b downward horizontally along the z axis while maintaining the x and y coordinates of the protrusion 111 to fit the protrusion 111 into the hole 126.

The operation to match the directions of the micro-mirror device die 104b and the package substrate 120b with each other by the side 113a of the micro-mirror device die 104b and the rotation stopper 123 is the same as that of the first example shown in FIG. 5.

Next, the sequel of the assembly of the micro-mirror device packages 30a and 30b of the first and second examples shown in FIGS. 5 and 6, respectively, is described with reference to FIGS. 7A and 7B, respectively.

Figure 7A:
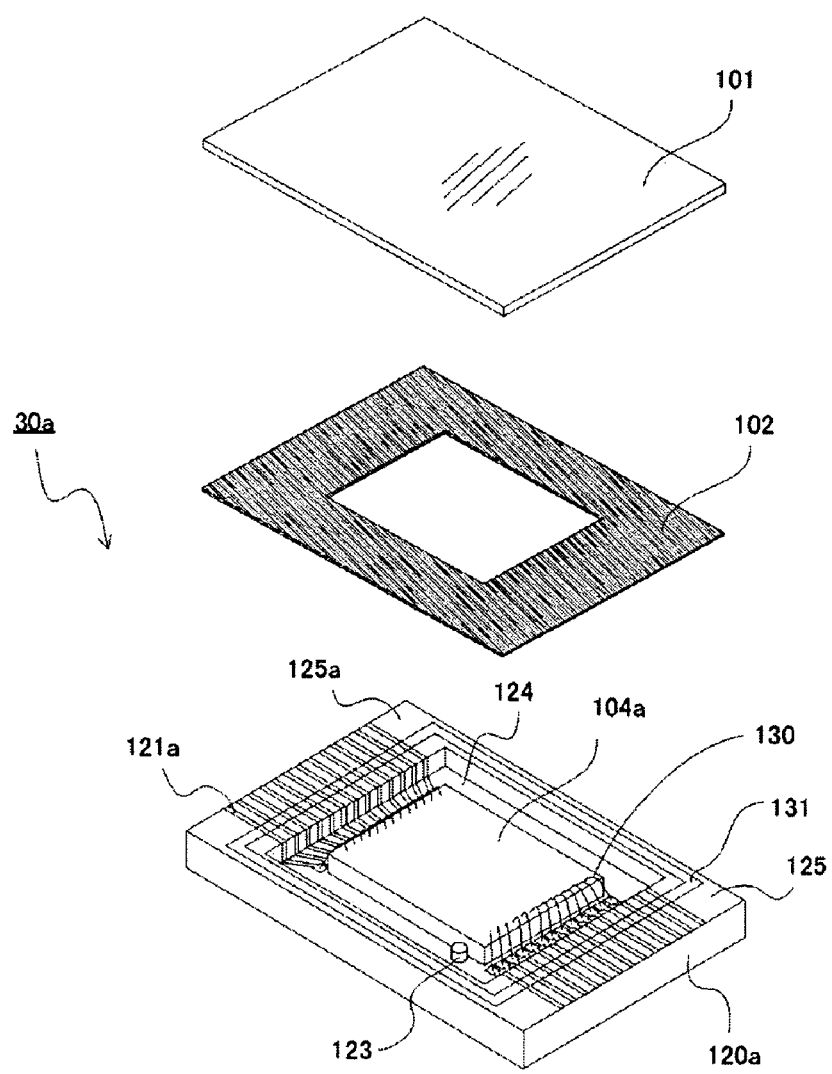
FIG. 7A is a disassembly/assembly view showing the state in the middle of the assembly of the first example of the micro-mirror device package.

FIG. 7A is a disassembly/assembly view showing the state in the middle of the assembly of the first example of the micro-mirror device package 30a. In FIG. 7A, the micro-mirror device die 104a is already fixed on the package substrate 120a by the method described with reference to FIG. 5.

After the micro-mirror device die 104a is fixed on the package substrate 120a, each of its terminals, which are not shown in FIG. 7A, is electrically connected to the conductive pattern 121a on the package substrate 120a by wire bonding. In FIG. 7A, a plurality of pieces of wiring 130 by wire bonding is shown.

The assembly device for assembling the micro-mirror device package 30a coats an adhesive 131 on the top 125a of the fringe 125 of the package substrate 120a in such a way as to enclose around the concavity 124. Then, when covering a mask 102 over the package substrate 120a, the mask 102 is adhered to the top 125a of the package substrate 120a by the adhesive 131.

Then, the assembly device, for example, coats an adhesive on the top of the mask 102 and covers a window 101 over it to adhere it to the mask 102. Alternatively, the window 101 can be bolted to the mask 102 and the package substrate 120b by a bolting portion, such as a pin, a screw and the like, which is not shown in FIG. 7A. Thus the micro-mirror device package 30a is completed. FIG. 7B is the perspective view of the completed micro-mirror device package 30a.

Figure 7B:
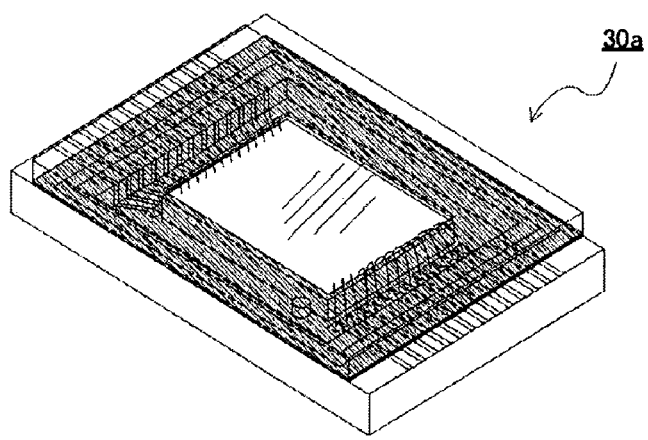
FIG. 7B is the perspective view of the first example of a micro-mirror device package.

In FIG. 7B, the mask is shown as another individual component, it can be also a film layer printed on the window 101 using a silk screen or the like.

The window 101 can be also mounted on the package substrate 120a using frit glass or solder. When jointing it thus, an appropriate surface treatment, such as metallization, activation or the like, is performed according to the material of the package substrate 120a. Since according to the above-described method, the micro-mirror device can be tightly sealed, the environment in the package can be maintained constant, which is more preferable.

The micro-mirror device package 30b shown in FIG. 6 is also assembled by the same assembly processes shown in FIGS. 7A and 7B.

Then, the third example of the micro-mirror device package is described with reference to FIGS. 8A~8C. Since the third example has many points common to the first example shown in FIGS. 5, 7A and 7B, its differences are mainly described.

FIG. 8A is the disassembly/assembly view of the micro-mirror device package 30c. Since the following points are the same as FIG. 5, their detailed descriptions are omitted.

The micro-mirror device package 30c comprises the window 101 and the mask 102.

The hole 110 is formed on the bottom of the micro-mirror device die 104a.

The protrusion 122 and the rotation stopper 123 are formed in the concavity 124 of the package substrate 120c.

FIG. 8A differs from FIG. 5 in that the micro-mirror device package 30c further comprises a rectangular frame-shaped spacer 103 and that the conductive pattern 121b is disposed on the package substrate 120c.

The spacer 103 in the third example is larger than the outer circumference of the concavity 124 of the package substrate 120c and smaller than the outer circumference of the package substrate 120c. The conductive pattern 121b in the third example is formed only on the top 125a of the fringe 125 of the package substrate 120c and is formed on neither the side 125b of the fringe 125 nor the base 124a of the concavity 124. Therefore, in the third example, the conductive pattern 121b can be formed on the package substrate 120c more easily than the first example.

FIG. 8B is a disassembly/assembly view showing the state in the middle of the assembly of the third example of the micro-mirror device package 30c. Like FIG. 7A, FIG. 8B shows the state after the micro-mirror device die 104a is fixed on the package substrate 120c. The assembly device for assembling the micro-mirror device package 30c coats an adhesive on the top 125a of the fringe 125 of the package substrate 120c in such a way as to cover around the concavity 124 and covers the spacer 103 over it to adhere it to the package substrate 120c.

FIG. 8B shows the case where wire bonding is applied between the micro-mirror device die 104a and the conductive pattern 121b after mounting the spacer 103 on the package substrate 120c. However, wire bonding can be also applied between the micro-mirror device die 104a and the conductive pattern 121b before mounting the spacer 103 on the package substrate 120c.

After mounting the spacer 103 and applying wire bonding to it, the assembly device coats an adhesive on the top of the spacer 103 and covers the mask 102 over it to adhere the spacer 103 and the mask 102. Furthermore, the assembly device coats an adhesive on the top of the mask 102 and covers the window 101 over it. As described earlier, the junction method of each member can be also different. FIG. 8C is the perspective view of the complete micro-mirror device package 30c assembled thus.

The spacer 103 appropriately sets a space between the micro-mirror device and the window which are disposed in the cavity (concavity 124) of the package and, for example, prevents the wire-bonding wire from touching the window. However, as shown in FIG. 6, if the relationship between the height dimension of the micro-mirror device and the depth of the cavity are appropriately set, it can be also omitted. In FIG. 6, although there is a space wiring exposed outside the package and a pad for wire bonding, generally speaking, forming wiring on the side wall (side 125b) of the cavity leads to its cost-up. Therefore, as shown in FIG. 8, it is preferable to provide the wiring exposed outside and the pad for wire bonding on the same plane and to save the spacer 103.

Then, the fourth example of the micro-mirror device package is described with reference to FIG. 9. The fourth example uses the spacer 103 as in the third example shown in FIGS. 8A~8C.

Figure 9:
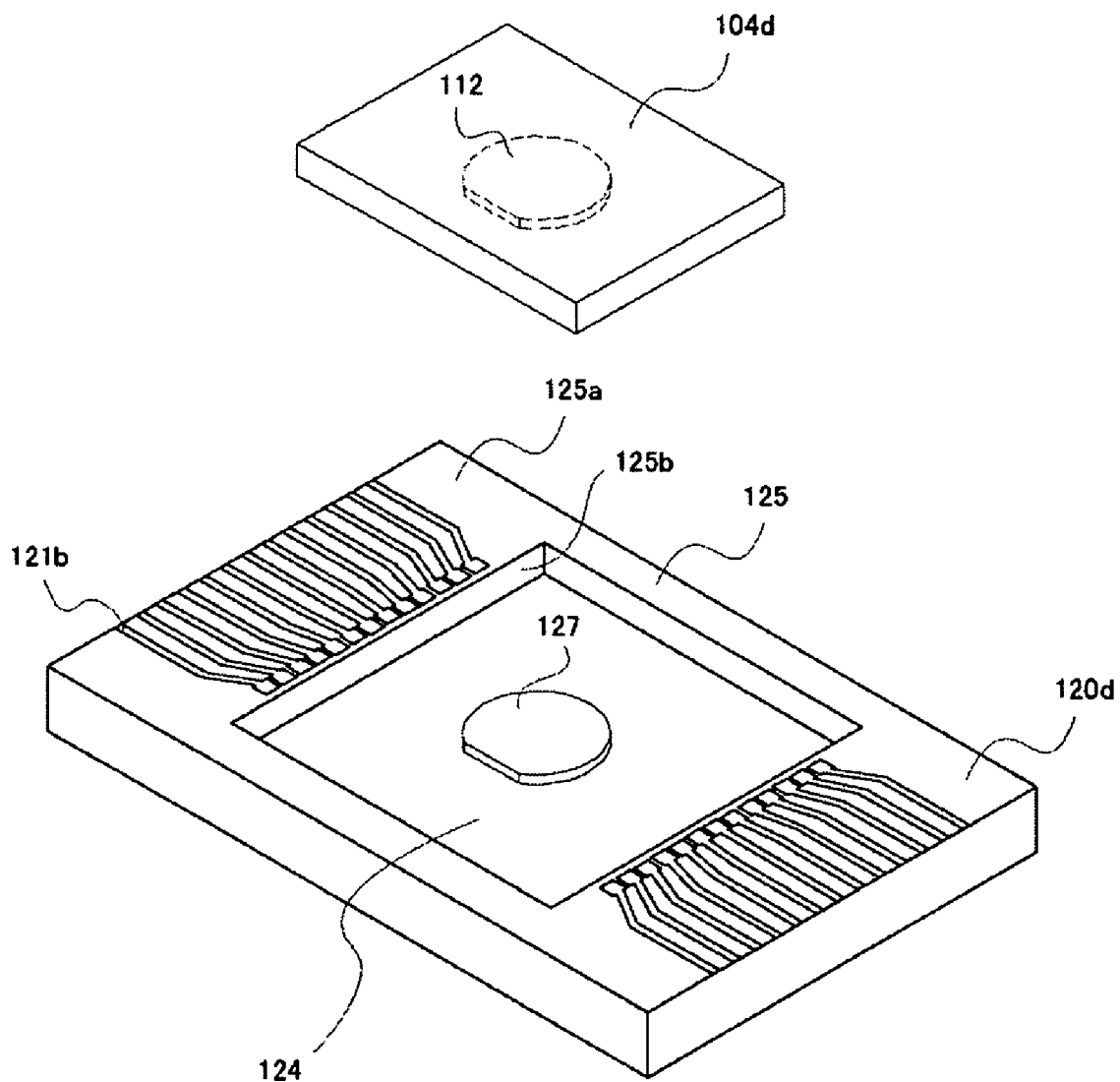
FIG. 9 is the disassembly/assembly view of the fourth example of the micro-mirror device package.

FIG. 9 is the disassembly/assembly view of the fourth example of the micro-mirror device package. Since the fourth example uses the window 101, the mask 102 and the spacer 103 as in the third example, their drawings and descriptions are omitted. FIG. 9 shows only the micro-mirror device die 104d and the package 120d of the components of the micro-mirror device package.

In the fourth example, the combination of a hole 112 formed on the bottom, which is not shown in FIG. 9, of the micro-mirror device die 104d and a protrusion 127 formed on the concavity 124 of the package substrate 120d realizes both the function of its alignment guide portion and the function to limit its rotation.

The micro-mirror device die 104d and the package substrate 120d are aligned by aligning the protrusion 127 to the hole 112. Specifically, the combination of the hole 112 and the protrusion 127 functions as a alignment guide portion as in the combination of the hole 110 and the protrusion 122 in the first example shown in FIG. 5.

The shape of the cross section of each of the hole 112 and the protrusion 127 is of almost D-character shape which is produced by removing a circular segment from a circle. Therefore, the protrusion 127 fits into the hole 112 unrotatably. Specifically, the hole 112 and the protrusion 127 realizes a function to limit the relative rotation of the micro-mirror device die 104d against the package substrate 120d depending on the shale of its cross section. Therefore, as different from the first example shown in FIG. 5, in the fourth example shown in FIG. 9, the relative rotation of the micro-mirror device die 104d against the package substrate 120d can be limited without forming the rotation stopper 123.

The shapes of the cross sections of the hole 112 and the protrusion 127 are not isotropic. This property realizes a function to limit the setting angle of the micro-mirror device die 104d against the package substrate 120e.

The shapes of the cross sections of the hole 112 and the protrusion 127 cannot be also the same as shown in FIG. 9. For example, it can be also a convex polygon, such as a regular hexagon, etc., a concave polygon, such as a stat-shape, etc. or any shape capable of limiting a rotation direction, such as an ellipse.

Next, the fifth example of the micro-mirror device package is described with reference to FIGS. 10 and 11. The fifth example is a variation of the fourth example shown in FIG. 9.

Figure 10:
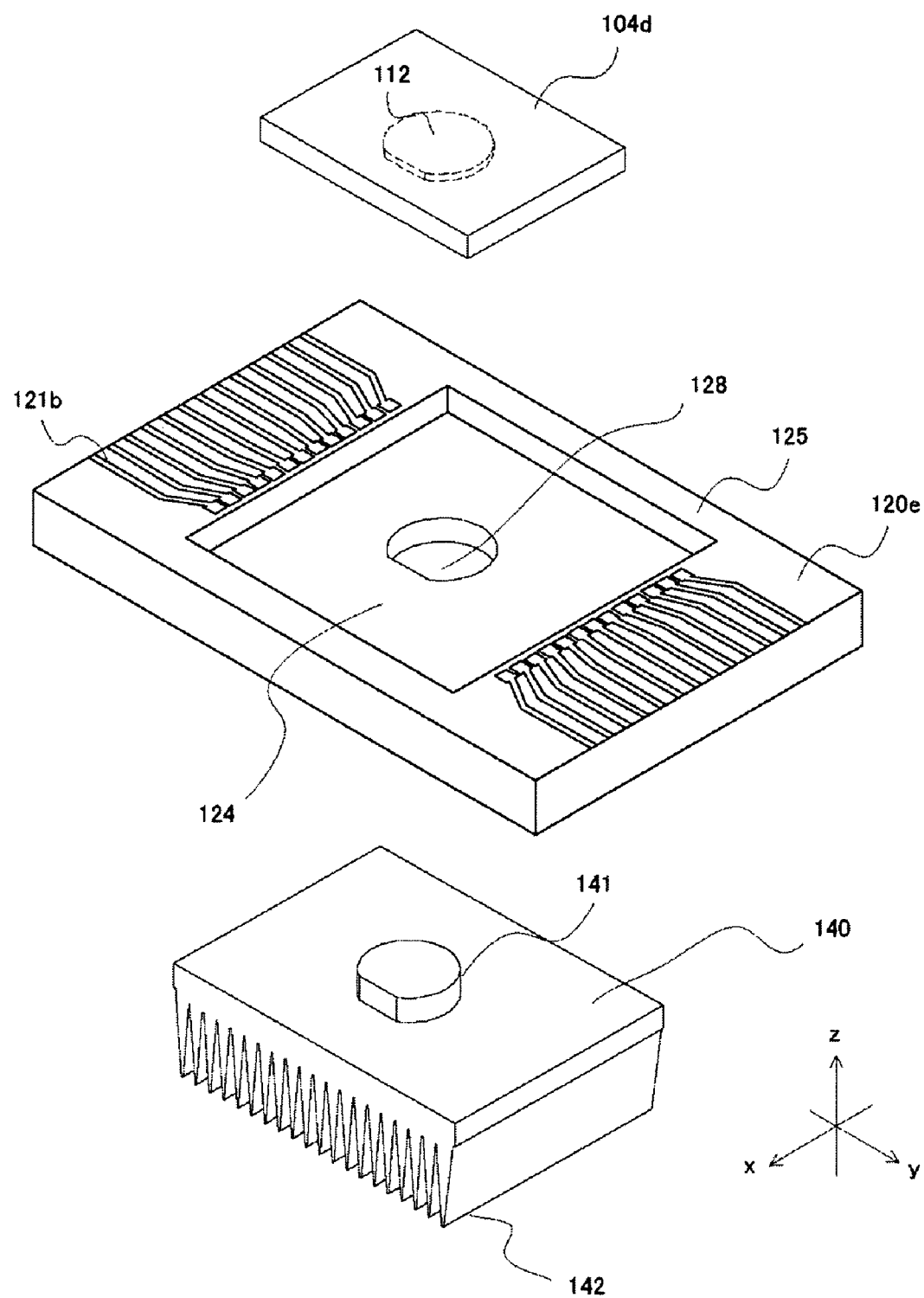
FIG. 10 is the disassembly/assembly view of the fifth example of the micro-mirror device package.

FIG. 10 is the disassembly/assembly view of the fifth example of the micro-mirror device package. Like FIG. 5, FIG. 10 also has coordinate axes.

FIG. 10 shows the micro-mirror device die 104d on the bottom of which the almost D-character-shaped hole 112 is formed as FIG. 9. A through hole 128 is formed in the concavity 124 of the package substrate 120e shown in FIG. 10 instead of the protrusion 127 shown in FIG. 9. The cross section of the through hole 128 is formed in an almost D-character shape obtained by removing a circular segment from a circle.

FIG. 10 further shows a heat sink 140. The heat sink 140 comprises a radiator 142 formed in the shape of saw teeth in order to efficiently radiate by increasing its surface area. The heat sink 140 further comprises a fitting protrusion member 141 having the same almost D-character-shaped cross section as the hole 112 and the through hole 128. The fitting protrusion member 141 protrudes from the top of the heat sink 140.

For example, the whole heat sink 140 including both the fitting protrusion member 141 and the radiator 142 can be also cast and incorporated. Alternatively, the fitting protrusion member 141 and the radiator 142 can be connected after forming them individually. It is preferable for the fitting protrusion member 141 and the radiator 142 to be made of a metal having high thermal conductivity, such as copper, aluminum, lead or the like.

In the fifth example shown in FIG. 10, the hole 112, the through hole 128 and the fitting protrusion member 141 function as guide portions for aligning the micro-mirror device die 104d to the package substrate 120e. Specifically, by matching the positions and directions of the hole 112, the through hole 128 and the fitting protrusion member 141 with each other in the assembly of the micro-mirror device package, the micro-mirror device die 104d is guided to correct position and direction against the package substrate 120e. Then, the fitting protrusion member 141 is fitted into and passed through the through hole 128 while maintaining the guided position and direction and by further fitting it into the hole 112, the micro-mirror device die 104d is fixed on the package substrate 120e.

In FIG. 10, the cross section of each of the hole 112, the through hole 128 and the fitting protrusion member 141 is formed in a shape obtained by removing a circular segment from a circle. Therefore, by matching the x and y coordinates of the two point at each end of its bowstring with those of each of the hole 112, the through hole 128 and the fitting protrusion member 141, the micro-mirror device die 104d is guided to correct position and direction against the package substrate 120e.

In the example shown in FIG. 10, the shape of the opening of the hole 112, the shape of the opening of the through hole 128 and the cross sectional shape of the fitting protrusion member 141 are almost the same. Therefore, in the state where the fitting protrusion member 141 passes through the through hole 128 and also fits into the hole 112, the outside of the fitting protrusion member 141 touches the inside of each of the through hole 128 and the hole 112. Thus the micro-mirror device die 104d is supported and fixed while maintaining the relative positions against the package substrate 120e.

The shape of each of the hole 112, the through hole 128 and the fitting protrusion member 141 limits its rotation as in the fourth example shown in FIG. 9. Therefore, in the state where the fitting protrusion member 141 passes through the through hole 128 and also fits into the hole 112, micro-mirror device die 104d is supported while maintaining not only a relative position against the package substrate 120e but also a relative angle against it.

Next, the micro-mirror device package assembled thus is described with reference to FIG. 11. FIG. 11 is the cross section view of the plane parallel with the xy plane of the fifth example of the micro-mirror device package.

Figure 11:
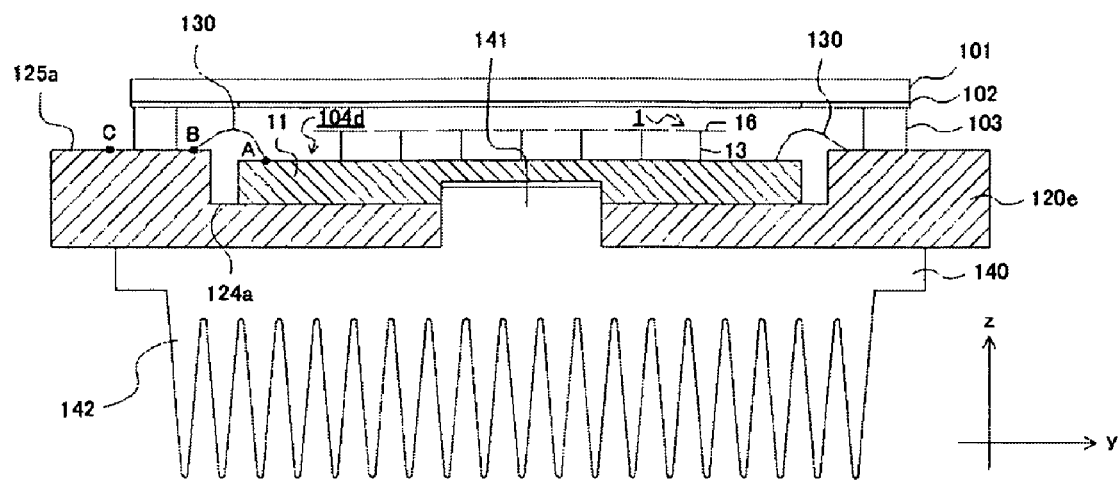
FIG. 11 is the cross section view of the fifth example of the micro-mirror device package.

FIG. 11 also shows the window 101, the mask 102, the spacer 103 and the mirror element 1 formed on the semiconductor substrate 11 of the micro-mirror device die 104d which are omitted in FIG. 10. In the description of FIG. 11 and after, the fact that it is after a wafer is separate by the dicing process is focused and a word "semiconductor substrate" is sometimes used instead of the word "semiconductor wafer substrate".

In FIG. 11, the fitting protrusion member 141 of the heat sink 140 passes through the through hole 128 of the package substrate 120e and also fits into the hole 112. The top of the heat sink 140 touches the bottom of the package substrate 120e.

As in the third example shown in FIGS. 8A~8C, the spacer 103 is mounted on the top 125a of the fringe 125 of the package substrate 120e and the mask 102 and the window 101 are mounted on the spacer 103. On the top 125a, the conductive pattern 121b, which is not shown in FIG. 11, is formed from a point C outside the range enclosed with the spacer 103 until a point B inside the range enclosed with the spacer 103. Therefore, the micro-mirror device die 104d and external equipment are electrically connected by connecting the point B and a point A where a terminal exists on the top of the semiconductor substrate 11 by wiring 130.

The heat sink 140 radiates heat generated by the drive of the mirror element 1. More particularly, heat is conveyed from the micro-mirror device die 104d to the heat sink 140 through the fitting protrusion member 141 touching the inside wall of the hole 112 of micro-mirror device die 104d and is radiated from the radiator 142.

Heat generated in the micro-mirror device die 104d is sometimes conveyed to the package substrate 120e through the base 124a of the concavity 124 of the package substrate 120e touching the bottom of the package substrate 120e. Since the package substrate 120e touches the heat sink 140 on the bottom and inside the through hole 128, a part of the heat generated in the micro-mirror device die 104d is conveyed and radiated to the heat sink 141 through the package substrate 120e.

However, a heat transfer surface coefficient between the micro-mirror device die 104d and the fitting protrusion member 141 can be made higher than a heat transfer surface coefficient between the micro-mirror device die 104d and the package substrate 120e by selecting a material having an appropriate thermal conductivity and forming the fitting protrusion member 141 using it. Thus heat can be radiated without passing it through the package substrate 120e as much as possible to realize more effective heat radiation.

Thus, by using the heat sink 140, the temperature of the micro-mirror device die 104d can be prevented from rising too high and the stable operation of the micro-mirror device die 104d can be assured.

Figure 12:
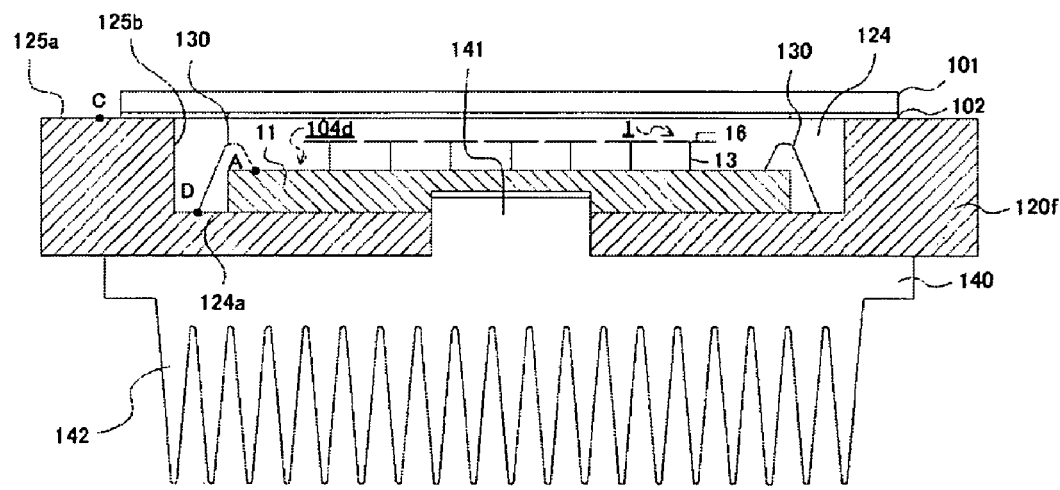
FIG. 12 is the cross section view of the sixth example obtained by transforming the fifth example of the micro-mirror device package.

Next, the sixth example of the micro-mirror device package is described with reference to FIG. 12. FIG. 12 is the cross section view of the sixth example obtained by transforming the fifth example of the micro-mirror device package. FIG. 12 differs from FIG. 11 only in that no spacer 103 is used and how to do wiring 130.

In the sixth example, the conductive pattern 121a, which is not shown in FIG. 12, is formed from a point C on the top 125a of the fringe 125 of the package substrate 120f until a point D on the base 124a of the concavity 124 along the side 125b of the fringe 125. It is in order to place the wiring 130 in the space of the concavity 124 of the package substrate 120f covered with the window 101 and the mask 102 to protect it that the conductive pattern 121a, which is not shown in FIG. 12, is formed on the three surfaces. In the sixth example, the micro-mirror device die 104d and external equipment are electrically connected by connecting the point D and a point A where a terminal exists on the semiconductor substrate 11 by wiring 130.

Figure 13:
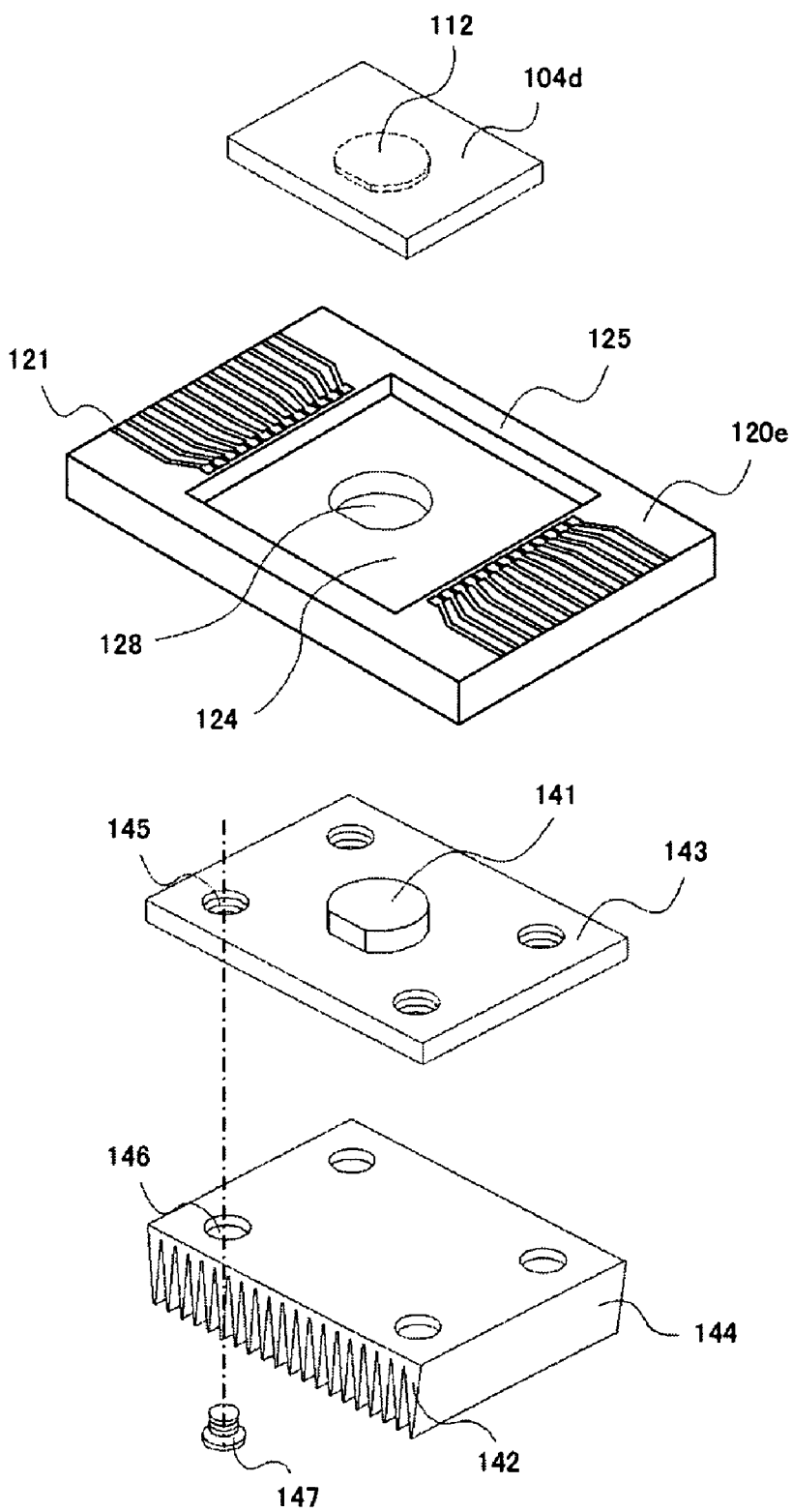
FIG. 13 is the disassembly/assembly view of the seventh example of the micro-mirror device package.

Then, the seventh example of the micro-mirror device package is described with reference to FIG. 13. FIG. 13 is the disassembly/assembly view of the seventh example of the micro-mirror device package. The seventh example also uses components for radiating heat generated in the micro-mirror device die 104d like the fifth and sixth examples. In FIG. 13, the window 101, the mask 102 and the spacer 103 are omitted.

Since the micro-mirror device die 104d and the package substrate 120e shown in FIG. 13 are the same of those of the fifth example shown in FIG. 10, their descriptions are omitted. FIG. 13 differs from FIG. 10 in the configuration of the heat radiation components. In FIG. 13, a heat sink main body 144 having the radiator 142 formed in the shape of saw teeth in order to increase its surface area is mounted on the package substrate 120e through a plate 143 being a flat plate.

A fitting protrusion member 141 similar to that shown in FIG. 10 is formed on the plate 143. The fitting protrusion member 141 and the plate 143 can be made of the same or different materials. The fitting protrusion member 141 and the plate 143 can be formed and incorporated. Alternatively, they can be formed individually and then be connected.

The cross sectional shape of the fitting protrusion member 141 is almost the same as those of the through hole 128 of the package substrate 120e and the hole 112 of the micro-mirror device die 104d. Therefore, as in the fifth example shown in FIG. 10, in the seventh example shown in FIG. 13, the hole 112, the through hole 128 and the fitting protrusion member 141 function as guide portions for aligning the micro-mirror device die 104d to the package substrate 120e. As the package substrate 120e, the hole 112, the through hole 128 and the fitting protrusion member 141 which are shown in FIG. 13 also have the function to limit the rotation of the micro-mirror device die 104d against the package substrate 120e.

According to the seventh example shown in FIG. 13 a roughly shaped heat sink main body 144 manufactured separately from the fitting protrusion member 141 which requires fine processing can be also used.

Four screw holes 145 in which a female screw thread is separate are formed on the plate 143. Four screw holes 146 are also formed in positions on the heat sink main body 144, corresponding to each screw hole 145. The screw hole 146 is a through hole. Although the screw hole 145 is a through hole, it cannot be also a through hole. The plate 143 and the heat sink main body 144 are jointed in the positions of the screw holes 145 and 146 by a bolt 147. In the example shown in FIG. 13, the plate 143 and the heat sink main body 144 are jointed in four places.

The plate 143 and the heat sink main body 144 that are jointed to each other function like the heat sink 140 shown in FIG. 10. Therefore, heat generated in the micro-mirror device die 104d is radiated from the radiator 142 through the fitting protrusion member 141.

Figure 14A:
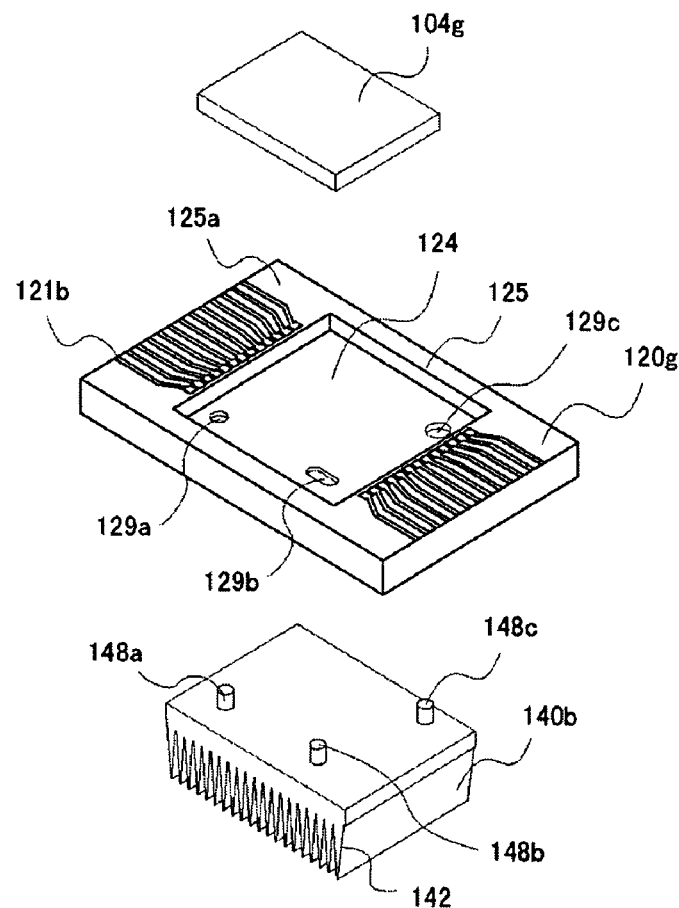
FIG. 14A is the disassembly/assembly view of the eighth example of the micro-mirror device package.
Figure 14B:
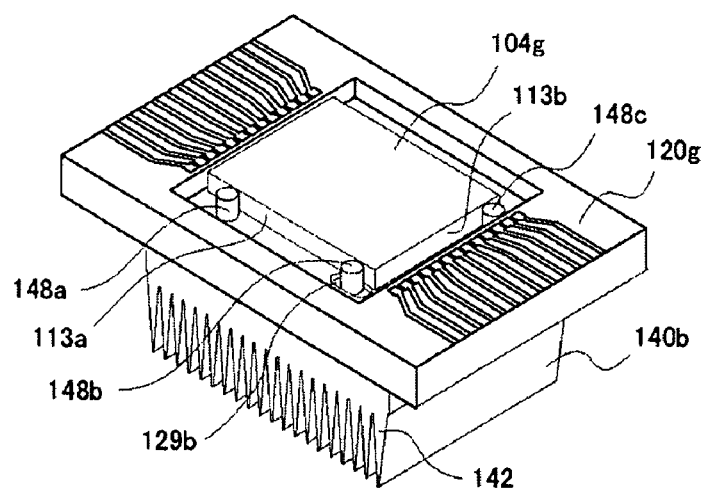
FIG. 14B is the perspective view of the eighth example of the micro-mirror device package.

Next, the eighth example of the micro-mirror device package is described with reference to FIGS. 14A and 14B. FIG. 14A is the disassembly/assembly view of the eighth example of the micro-mirror device package. FIG. 14B is the perspective view of the eighth example of the micro-mirror device package. In FIGS. 14A and 14B, the window 101, the mask 102 and the spacer 103 are omitted.

Neither protrusion nor hole is formed on the micro-mirror device die 104g.

The package substrate 120g is similar to the package substrate 120e in the fifth example shown in FIG. 10 in that the concavity 124 is formed on it and the conductive pattern 121b is formed only on the top 125a of the fringe 125. However, the micro-mirror device 120g is different from the micro-mirror device 120e in that three through holes 129a, 129b and 129c are formed on the concavity 124. In the example shown in FIG. 14A, although the cross sectional shapes of the through holes 129a and 129c are circles, that of the through hole 129b is a shape obtained by extending a circle in one direction.

The heat sink 140b comprises a radiator 142 formed in the shape of saw teeth in order to efficiently radiate heat like the heat sink 140 shown in FIG. 10. However, the structure on the top of the heat sink 140 is different from that of the heat sink 140b.

As shown in FIG. 14A, three protrusions 148a, 148b and 148c are formed on the top of the heat sink 140b. These protrusions 148a~148c are almost cylinders. The protrusions 148a~148c are formed in positions corresponding to the through holes 129a~129c, respectively. A metal having high thermal conductivity is preferable as the materials of the protrusions 148a~148c.

Next, the function of each component in the eighth example is described with reference to FIG. 14B.

The function as a guide portion for correctly aligning the micro-mirror device die 104g to the package substrate 120g is realized by the protrusions 148a~148c, the through holes 129a~129c and the sides 113a and 113b of the micro-mirror device die 104g. Specifically, the positions of the protrusions 148a~148c and the through holes 129a~129c are determined in such a way that the protrusions 148a~148c may touch the side 113a and 113b of the micro-mirror device die 104g when the protrusions 148a~148c pass through the protrusions 148a~148c, respectively.

Therefore, as shown in FIG. 14B, in the assembled state the protrusions 148a and 148b pass through the protrusions 148a and 148b, respectively, and touch the side 113a of the micro-mirror device die 104g. The protrusion 148c passes through the through hole 129c and touches the side 113b of the micro-mirror device die 104g. By the touch in these three places, the micro-mirror device die 104g is supported and fixed in the correct position and direction against the package substrate 120g.

The function as a rotation stopper for limiting the relative rotation against the package substrate 120g of the micro-mirror device die 104g is realized by the protrusions 148a~148c, the through holes 129a~129c and the side 113a and 113b of the micro-mirror device die 104g. As described above, since the micro-mirror device die 104g is supported by the through holes 129a~129c which touches the side 113a and 113b, its rotation is limited.

The function to radiate heat generated in the micro-mirror device die 104g is realized by the heat sink 140b including the protrusions 148a~148c. The protrusions 148a~148c which touch the micro-mirror device die 104g not only support the micro-mirror device die 104g in correct position and direction, but also constitutes a heat conveyance route for heat radiation. Heat generated in the micro-mirror device die 104g is radiated from the radiator of the heat sink 140b through the protrusions 148a~148c. It is preferable for the protrusions 148a~148c to be made of a metal having high thermal conductivity. Although this preferred embodiment positions the micro-mirror device die 104g on the basis of two sides as in the publicly known example described in Patent Document 8, this preferred embodiment differs from the publicly known example in that two alignment points have radiation functions.

Figure 15:
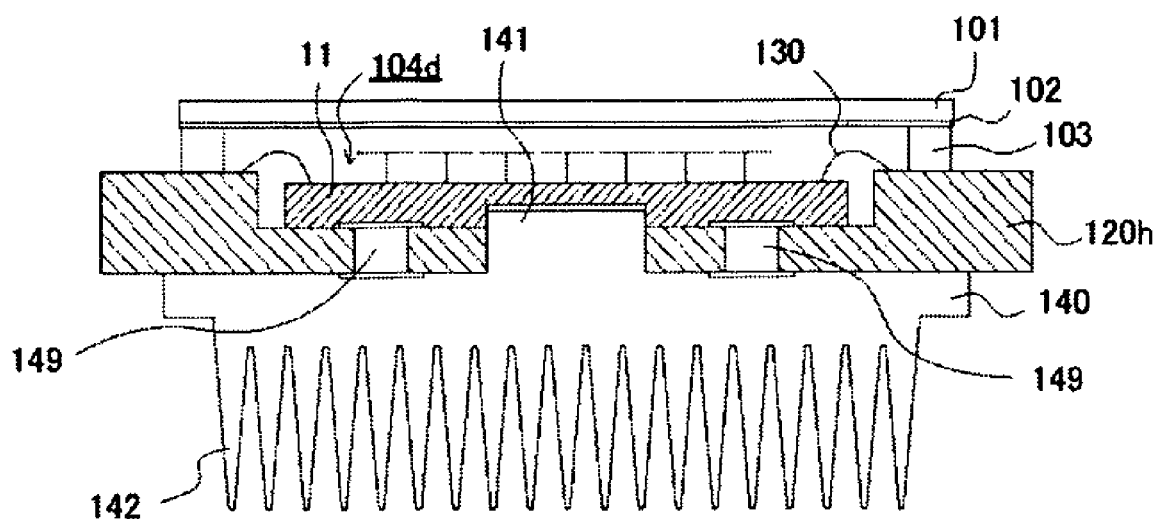
FIG. 15 is the disassembly/assembly view of the ninth example of the micro-mirror device package.

Then, the ninth example of the micro-mirror device package is described with reference to FIG. 15. FIG. 15 is the disassembly/assembly view of the ninth example of the micro-mirror device package. In the ninth example, the descriptions of the same components as in the fifth example shown in FIG. 11 are omitted from time to time.

In FIG. 15, the fitting protrusion member 141 functioning as a alignment portion (that is, alignment guide portion) passes through the package substrate 120h and further fits into the hole 112 of the micro-mirror device die 104d. Thus the relative position and direction against the package substrate 120h of the micro-mirror device die 104 are correctly fixed.

The fitting protrusion member 141 is made of a material having higher thermal conductivity than the package substrate 120h. Therefore, heat generated in package substrate 120h is efficiently radiated from a portion where the package substrate 120h touches the package substrate 120h.

In FIG. 15, in order to improve the radiation efficiency, a heat conductor 149 vertically passing through package substrate 120h is provided in addition to the fitting protrusion member 141. Although FIG. 15 shows two heat conductors 149, the number of the heat conductors 149 is arbitrary. The heat conductor 149 is also made of a material having higher thermal conductivity than the package substrate 120h. The heat conductor 149 touches both the bottom of the micro-mirror device die 104 and the top of the heat sink 140 and efficiently conveys heat from the micro-mirror device die 104 to the heat sink 140. Thus in the ninth example shown in FIG. 15 efficient radiation is realized by the heat conductor 149.

Although so far various examples have been described, some points common to these examples are described below.

When a protrusion fitted into a hole for alignment is provided for the micro-mirror device die (or the package substrate), the protrusion can be made of the same material as or different from that of the micro-mirror device die (or the package substrate). When making the protrusion of different material from that the micro-mirror device die (or the package substrate), it is preferable for the material to be a metal having high thermal conductivity, such as copper, aluminum, zinc or the like. This is because one protrusion can realize two functions of alignment and heat radiation by using a metal having high thermal conductivity.

A protrusion itself made of a metal having high thermal conductivity can also form the heat sink. Alternatively, as shown in FIGS. 10~15, a configuration where a protrusion bring fitting member passes through the package substrate and is connected to a radiation component can be adopted.

The some above-described examples can be roughly classified into the two following groups according to the alignment and fixation method of the micro-mirror device die and the package substrate.

(1) A hole and a protrusion are formed one and the other of the micro-mirror device die and the package substrate. The hole and the protrusion are used as alignment guide portions. The micro-mirror device die is fixed on the package substrate by fitting the protrusion into the hole.

(2) A common member touches the prescribed portions (that is, portions functioning as alignment guide portions) of both the micro-mirror device die and the package substrate and supports the micro-mirror device die in prescribed position and direction against the package substrate. Either the hole or its outside can be a guide portion.

The above-described examples can be transformed from various points of view. Two viewpoints of the transformation are described below.

One viewpoint of the transformation is a method for limiting the relative rotation between the micro-mirror device die and the package substrate. This viewpoint is described using a case where the first example shown in FIG. 5 is transformed with reference to FIGS. 16A~16D. Similar transformation can be applied to the other examples.

FIGS. 16A~16D are the section views on a plane parallel with the xv plane showing methods for limiting the rotation of the micro-mirror device package. Although coordinate axes are shown only in FIG. 16A, the coordinate axes also apply to FIGS. 16B~16D.

FIG. 16A corresponds to the first example shown in FIG. 5. Specifically, the hole 110 is formed in the micro-mirror device die 104a and the protrusion 122 formed in the concavity 124 of the package substrate 120a fits into the hole 110. When the micro-mirror device die 104a is in the correct position and direction, the rotation stopper 123 touches the side 113a of the micro-mirror device die 104a to limit its rotation.

FIG. 16B shows an example of limiting the rotation of the micro-mirror device die 104h by another method. In FIG. 16B, in addition to the hole 110, a hole 110b is further formed in the micro-mirror device die 104h. Then, a protrusion 122b is formed in the concavity of the package substrate in accordance with the position of the hole 110b.

The hole 110b is an elongated hole. The cross section of the hole 110b is formed in a shape obtained by sweeping a circle being the cross sectional shape of the protrusion 122b in the direction of a line 150 connecting the protrusions 122 and 122b. It is in order to simplify its assembly that the cross section of the hole 110 is made larger than the cross section of the protrusion 122b.

The relative position and direction against the package substrate of the micro-mirror device die 104h are fixed by fitting the protrusions 122 and 122b into the holes 110 and 110b, respectively, in a plurality of places inside the micro-mirror device die 104h. In the state where the protrusion 122 fits into the hole 110 and also the protrusion 122b fits into the hole 110b, the protrusion 122b neither moves nor slides in the space of the hole 110b. Specifically, only by touching the inside of the hole 110 in a part of its outside, the protrusion 122b fits into the hole 110b while holding the position against the hole 110b.

Specifically, in FIG. 16B, the protrusions 122 and 122b and the holes 110 and 110b function as aligning the micro-mirror device die 104h to the package substrate and also limits the rotation against the package of the micro-mirror device die 104h.

FIG. 16C shows an example obtained by further transforming the example shown in FIG. 16B. In FIG. 16C too, two sets of a hole and a protrusion (that is, the set of the hole 110 and the protrusion 122 and the set of the hole 110c and the protrusion 122c) function as alignment guide portions and also limits the rotation against the package of the micro-mirror device die 104i. In this point, FIGS. 16C and 16B are the same.

FIG. 16C differs from FIG. 16B in that the cross sectional shape of the hole 110c shown in FIG. 16C is a circle and that that of the protrusion 122c is an ellipse touching the inside of the hole 110. The cross sectional shape of the protrusion 122c is short in the direction of the line 150 and long in the direction of a line 151 orthogonal to the line 150. The protrusion 122c touches the inside of the hole 110 at two points on the line 151.

FIG. 16D shows an example obtained by transforming that shown in FIG. 16A. FIG. 16D differs from FIG. 16A only in the cross sectional shape of a protrusion 122d fitted into the hole 110. The protrusion 122d touches the hole 110 at three places corresponding to each end of a character Y. Even when the protrusion 122d is fitted into the hole 110 by partially touching each other, the micro-mirror device die 104a can be positioned against the package substrate and be fixed.

Next, as the second viewpoint of the transformation, the respective shapes of the protrusion and the hole, for simplifying the assembly process are described with reference to FIGS. 17A~17D. Any of FIGS. 17A~17D is a cross section view on a plane parallel with the xy plane. Although coordinate axes are shown only in FIG. 17A, the coordinate axes also apply to FIGS. 17B~16D.

For example, in the first example shown in FIG. 5, the inside of the hole 110 and the outside of the protrusion 122 can be also formed in the same shape (for example, in the same cylinder, in the same shape of a tapered shaft or the like). Specifically, the hole 110 and the protrusion 122 can be also formed in such a way that the whole outside of the protrusion 122 touches the inside of the hole 110.

In the second example shown in FIG. 6, the outside of the protrusion 111 and the inside of the hole 126 can be also formed in the same shape. Specifically, the protrusion 111 and the hole 126 can be also formed in such a way that the whole outside of the protrusion 111 touches the inside of the hole 126.

However, when the outside of the protrusion and the inside of the hole are formed in the same shape, in order to fit the protrusion into the hole smoothly and quickly in the assembly process, the directions of the protrusion and the hole must be matched with very high accuracy. Therefore, when it is assembled by the assembly device, complex and highly accurate control is required. While when it is assembled by a human worker, a high skill is required.

If the protrusion and the hole are formed in the tapered shape, the assembly process can be simplified. This is because the fitting operation can be gradually advanced while allowing the micro-mirror device die and the package substrate to move relatively within the range of a space formed by the tapered shape. Therefore, there is no need to match the directions of the protrusion and the hole with very high accuracy before the fitting operation. The directions of the protrusion and the hole are gradually adjusted along the progress of the fitting operation and as a result they are matched with each other with high accuracy.

Figure 17A:
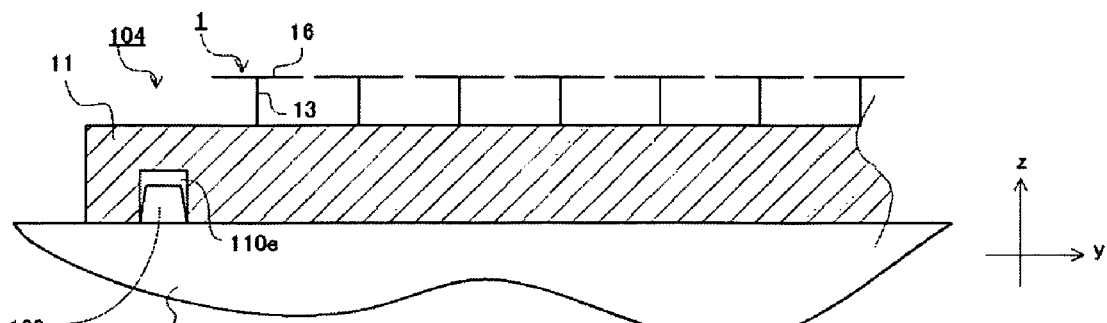
FIG. 17A is a cross section view showing a taper-shaped protrusion.

FIG. 17A is a cross section view showing a protrusion in the tapered shape. In FIG. 17A, the micro-mirror device die 104 and the package 120 are provided with a hole 110e and a protrusion 122e. The inside of the hole 111 is formed in a cylinder shape. The protrusion 122e is tapered towards the top.

Figure 17B:
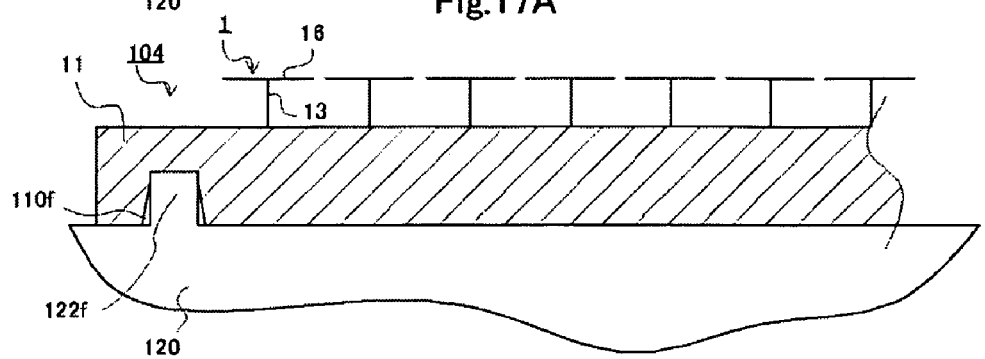
FIG. 17B is a cross section view showing a taper-shaped hole.

FIG. 17B is a cross section view showing a hole in the tapered shape. In FIG. 17B, the micro-mirror device die 104 and the package 120 are provided with a hole 110f and a protrusion 122f. The outside of the protrusion 122f is formed in a cylinder shape. The hole 110f is extended towards the bottom opening.

Figure 17C:
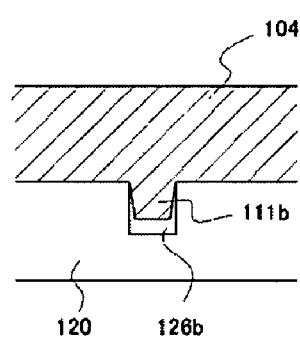
FIG. 17C is a cross section view showing a taper-shaped protrusion.

FIG. 17C is a cross section view showing a protrusion in the tapered shape. In FIG. 17C, the micro-mirror device die 104 and the package 120 are provided with a protrusion 111b and a hole 126b. The inside of the hole 126b is formed in a cylinder shape. The protrusion 111b is tapered towards the bottom.

Figure 17D:
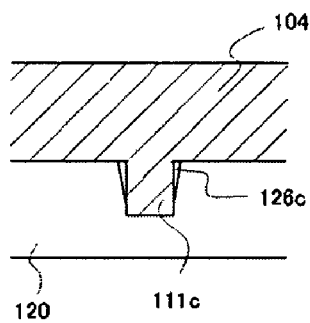
FIG. 17D is a cross section view showing a taper-shaped hole.

FIG. 17D is a cross section view showing a hole in the tapered shape. In FIG. 17D, the micro-mirror device die 104 and the package 120 are provided with a protrusion 111c and a hole 126c. The outside of the protrusion 111c is formed in a cylinder shape. The hole 126c is extended towards the top opening.

In any of the examples shown in FIGS. 17A~17D, at the staring time of the fitting operation by an assembly device or a human worker, the range of a space formed by the tapered shape is wide and becomes narrower as the fitting operation progresses. Therefore, the directions of the protrusion and the hole are gradually adjusted as the fitting operation progresses and are matched with high accuracy as a result of the fitting operation.

In any of the examples shown in FIGS. 17A~17D, the cross sectional shapes of the protrusion and hole on a plane parallel with the xy plane can be arbitrarily changed. For example, the through hole 128 shown in FIG. 10 can be also changed to a tapered shape.

The present invention is not limited to the above-described preferred embodiments, and for example, the operation test in step 15 shown in FIG. 3B can also be conducted after the packaging. Alternatively, another process for forming another MEMS structure can be applied. Although in step 12 shown in FIG. 3B an opening Z is formed, the timing of forming the opening Z is arbitrary.

Besides, concerning the protection of the micro-mirror device 10 at the time of the dicing, described with reference to step 12 shown in FIG. 3B and FIG. 4, another preferred embodiment can be also adopted. Specifically, water (H$_2$O) or the like can be also used for the inorganic protection layer 17, it can be also deposited on the mirror layer 16 and the inorganic protection layer 17 can be also solidified in advance in the environment of being lower than the melting point, that is, 0° C. in the case of H$_2$O. Then, the dicing can be also performed. In this preferred embodiment, the inorganic protection layer 17 can be also formed and removed by temperature control. For example, after the dicing, the inorganic protection layer 17 can be exposed to an environment of being lower than its melting point and the protection layer can be removed.

The above-described preferred embodiments can provide a micro-mirror manufacturing method for protecting the micro-mirror device comprising at least one mirror element including a deflectable mirror when separating individual micro-mirror devices from a wafer. The above-described preferred embodiments can also provide a micro-mirror manufacturing method for reducing influences on a mirror surface more than the traditional method when removing an inorganic protection layer and for simplifying its process.

The above-described manufacturing method can easily avoid factors for its poor operation, such as the function deterioration of a mirror due to an attached foreign object and a defect when dicing a mirror surface, the mixture of a foreign object into the elastic hinge, influences on the drive circuit or the pole which are mounted on the semiconductor wafer substrate.

The above-described preferred embodiments can also position the micro-mirror device package in and fix on the package substrate with high accuracy and can provide it. The highly accurate alignment contributes to the improvement of the quality of projected and displayed images or the simplification of the adjustment of the mounting position of the micro-mirror device package in each piece of equipment. Therefore, the highly accurate alignment improves the function of the whole micro-mirror device package.

As described above, this specification describes a preferred embodiment which is an example of a micro-mirror manufacturing method for separating micro-mirror devices composed of mirror elements including a deflectable mirror, comprising a step of depositing an inorganic protection layer on a mirror before separating micro-mirror devices from a wafer and a step of removing the inorganic protection layer after separating micro-mirror devices from a wafer.

This specification also describes a preferred embodiment which is an example of a method for aligning and fixing a micro-mirror device die having a plurality of micro-mirrors formed on a semiconductor substrate to and on a package substrate, comprising a first alignment step of aligning a first guide portion of the micro-mirror device die to a second guide portion of the package substrate and a fixing step of fixing the micro-mirror device die on the package substrate in a position determined by the first alignment step using the first and second guide portions.

This specification also describes a preferred embodiment which is an example of a micro-mirror device package comprising a plurality of micro-mirrors formed on a semiconductor substrate, a micro-mirror device die having a first guide portion and a package substrate having a second guide portion in which the micro-mirror device die is fixed on the package substrate by the first and second guide portions.

Although the reference examples as specific preferred embodiments of the present invention have been described, it is clear that these preferred embodiments can be modified and changed as long as the range of the present invention and its concept is not deviated. Therefore, this specification and drawings should not be considered to be limiting and should be considered to be specific examples.

What is claimed is:

1. A micro-mirror device package, comprising:
    a micro-mirror device die having a plurality of micro-mirror devices formed on a semiconductor substrate and a first guide portion; and
    a package substrate having a second guide portion, wherein the micro-mirror device die is fixed on the package substrate by the first and second guide portions;
    a third guide portion touching both the first and second guide portions and supporting the micro-mirror device die while maintaining its relative position against the package substrate; and
    a material forming the third guide portion has higher thermal conductivity than a material forming the package substrate.

2. The micro-mirror device package according to claim 1, wherein:
    one of the first and second guide portions is a hole,
    the other of the first and second guide portions is a protrusion which fits into the hole and
    the micro-mirror device die is fixed on the package substrate by the fitting of the protrusion into the hole.

3. The micro-mirror device package according to claim 2, wherein:
    at least one of the hole and the protrusion is formed in a tapered shape.

4. The micro-mirror device package according to claim 2, wherein:
    the protrusion fits into the hole unrotatably.

5. The micro-mirror device package according to claim 1, wherein:
    the first and second guide portions both are holes, and
    the third guide portion is a protrusion which fits into both the first and second guide portions.

6. The micro-mirror device package according to claim 1, wherein:
    the second guide portion is a plurality of through holes,
    the third guide portion is a plurality of protrusions each of which fits each of the plurality of through holes and passes through the package substrate,
    the first guide portion is an outside of the micro-mirror device die as a guide surface for aligning the micro-mirror device die in a position where the micro-mirror device die touches each of the plurality of protrusions that passes through each of the plurality of through holes, and
    each of the plurality of protrusions that passes through each of the plurality of through holes supports the micro-mirror device die by touching the micro-mirror device die on the guide surface.

7. The micro-mirror device package according to claim 1, further comprising:
    a rotation stopper for preventing the micro-mirror device die from relatively rotating against the package substrate.

8. The micro-mirror device package according to claim 7, wherein:
    the rotation stopper is a protrusion provided on the package substrate and is provided in a position where the rotation stopper touches the micro-mirror device die when the micro-mirror device die is in a position and a direction in which the micro-mirror device die should be fixed.

9. The micro-mirror device package according to claim 1, wherein:
the micro-mirror device die comprises a plurality of first guide portions,
the package substrate comprises a plurality of second guide portions and
a position and a direction against the package substrate of the micro-mirror device die is fixed by fixing the first and second guide portions which correspond to each other in a plurality of places.

10. A micro-mirror device package comprising:
a micro-mirror device die having a plurality of micro-mirror devices formed on a semiconductor substrate and a first guide portion; and
a package substrate having a second guide portion, wherein the micro-mirror device die is fixed on the package substrate by the first and second guide portions;
a third guide portion touching both the first and second guide portions and supporting the micro-mirror device die while maintaining its relative position against the package substrate; and
a heat transfer surface coefficient between the micro-mirror device die and the third guide portion is higher than a heat transfer surface coefficient between the micro-mirror device die and the package substrate.

11. A micro-mirror device package comprising:
a micro-mirror device die having a plurality of micro-mirror devices formed on a semiconductor substrate and a first guide portion; and
a package substrate having a second guide portion, wherein the micro-mirror device die is fixed on the package substrate by the first and second guide portions;
a third guide portion touching both the first and second guide portions and supporting the micro-mirror device die while maintaining its relative position against the package substrate; and
a radiation member jointed to the third guide portion or incorporated into the third guide portion.

12. A micro-mirror device package comprising:
a micro-mirror device die having a plurality of micro-mirror devices formed on a semiconductor substrate and a first guide portion; and
a package substrate having a second guide portion, wherein the micro-mirror device die is fixed on the package substrate by the first and second guide portions; and
a heat transfer member passing from a first surface touching the micro-mirror device die to a second surface opposing the first surface of the package substrate.

13. A micro-mirror device package comprising:
a micro-mirror device die having a plurality of micro-mirror devices formed on a semiconductor substrate; and
a radiation member directly jointed to or incorporated into the micro-mirror device die.

* * * * *